(12) United States Patent
Henley

(10) Patent No.: US 7,759,220 B2
(45) Date of Patent: Jul. 20, 2010

(54) METHOD AND STRUCTURE FOR FABRICATING SOLAR CELLS USING A LAYER TRANSFER PROCESS

(75) Inventor: Francois J Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 43 days.

(21) Appl. No.: 11/784,524

(22) Filed: Apr. 5, 2007

(65) Prior Publication Data
US 2008/0160661 A1 Jul. 3, 2008

Related U.S. Application Data

(60) Provisional application No. 60/789,730, filed on Apr. 5, 2006.

(51) Int. Cl.
H01L 21/30 (2006.01)
H01L 21/46 (2006.01)
(52) U.S. Cl. .................. 438/458; 438/455; 257/E21.48; 257/E21.568
(58) Field of Classification Search .................. 438/458, 438/455; 257/E21.48, E21.568
See application file for complete search history.

(56) References Cited

U.S. PATENT DOCUMENTS

| | | | |
|---|---|---|---|
| 2,981,877 A | 4/1961 | Noyce | |
| 4,363,828 A | 12/1982 | Brodsky et al. | |
| 4,367,411 A | 1/1983 | Hanley et al. | |
| 4,585,671 A | 4/1986 | Kitagawa et al. | |
| 4,696,758 A | 9/1987 | Ovshinsky et al. | |

(Continued)

FOREIGN PATENT DOCUMENTS

JP 62-188150 A 8/1987

(Continued)

OTHER PUBLICATIONS

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

(Continued)

*Primary Examiner*—Jarrett J Stark
(74) *Attorney, Agent, or Firm*—Townsend and Townsend and Crew LLP

(57) ABSTRACT

A reusable silicon substrate device for use with layer transfer process. The device has a reusable substrate having a surface region, a cleave region, and a total thickness of material. The total thickness of material is at least N times greater than a first thickness of material to be removed. In a specific embodiment, the first thickness of material to be removed is between the surface region and the cleave region, whereupon N is an integer greater than about ten. The device also has a chuck member adapted to hold a handle substrate member in place. The chuck member is configured to hold the handle substrate in a manner to facilitate bonding the handle substrate to the first thickness of material to be removed. In a preferred embodiment, the device has a mechanical pressure device operably coupled to the chuck member. The mechanical pressure device is adapted to provide a force to cause bonding of the handle substrate to the first thickness of material to be removed.

25 Claims, 25 Drawing Sheets

U.S. PATENT DOCUMENTS

| | | | |
|---|---|---|---|
| 4,799,392 A | 1/1989 | Wilson et al. | |
| 4,980,562 A | 12/1990 | Berrian et al. | |
| 4,981,408 A | 1/1991 | Hughes | |
| 5,120,394 A | 6/1992 | Mukai | |
| 5,132,544 A | 7/1992 | Glavish | |
| 5,196,710 A | 3/1993 | Kalfaian | |
| 5,311,028 A | 5/1994 | Glavish | |
| 5,374,564 A * | 12/1994 | Bruel | 438/455 |
| 5,393,984 A | 2/1995 | Glavish | |
| 5,438,203 A | 8/1995 | Glavish et al. | |
| 5,481,116 A | 1/1996 | Glavish et al. | |
| 5,483,077 A | 1/1996 | Glavish | |
| 5,672,879 A | 9/1997 | Glavish | |
| 5,789,030 A | 8/1998 | Rolfson | |
| 5,877,070 A | 3/1999 | Gösele et al. | |
| 6,013,563 A * | 1/2000 | Henley et al. | 438/458 |
| 6,033,974 A | 3/2000 | Henley et al. | |
| 6,100,166 A | 8/2000 | Sakaguchi et al. | |
| 6,103,599 A | 8/2000 | Henley et al. | |
| 6,146,979 A * | 11/2000 | Henley et al. | 438/458 |
| 6,162,705 A | 12/2000 | Henley et al. | |
| 6,171,965 B1 | 1/2001 | Kang et al. | |
| 6,180,496 B1 | 1/2001 | Farrens et al. | |
| 6,190,937 B1 * | 2/2001 | Nakagawa et al. | 438/67 |
| 6,207,964 B1 | 3/2001 | McIntyre et al. | |
| 6,245,161 B1 | 6/2001 | Henley et al. | |
| 6,287,941 B1 | 9/2001 | Kang et al. | |
| 6,313,475 B1 | 11/2001 | Renau et al. | |
| 6,368,930 B1 | 4/2002 | Enquist | |
| 6,391,740 B1 | 5/2002 | Cheung et al. | |
| 6,391,743 B1 * | 5/2002 | Iwane et al. | 438/458 |
| 6,455,399 B2 | 9/2002 | Malik et al. | |
| 6,500,694 B1 | 12/2002 | Enquist | |
| 6,534,381 B2 | 3/2003 | Cheung et al. | |
| 6,548,382 B1 * | 4/2003 | Henley et al. | 438/526 |
| 6,558,802 B1 | 5/2003 | Henley et al. | |
| 6,563,133 B1 | 5/2003 | Tong | |
| 6,586,785 B2 | 7/2003 | Flagan | |
| 6,627,531 B2 | 9/2003 | Enquist | |
| 6,653,212 B1 | 11/2003 | Yamanaka et al. | |
| 6,696,688 B2 | 2/2004 | White et al. | |
| 6,699,531 B1 | 3/2004 | Fukiage | |
| 6,716,751 B2 | 4/2004 | Todd | |
| 6,723,606 B2 | 4/2004 | Flagan | |
| 6,740,909 B2 | 5/2004 | Enquist | |
| 6,756,281 B2 | 6/2004 | Enquist | |
| 6,771,410 B1 | 8/2004 | Bourianoff | |
| 6,804,062 B2 | 10/2004 | Atwater | |
| 6,818,529 B2 | 11/2004 | Bachrach | |
| 6,821,825 B2 | 11/2004 | Todd et al. | |
| 6,822,326 B2 | 11/2004 | Enquist et al. | |
| 6,858,107 B2 | 2/2005 | Ghyselen et al. | |
| 6,858,517 B2 | 2/2005 | Martinez et al. | |
| 6,864,585 B2 | 3/2005 | Enquist | |
| 6,867,073 B1 | 3/2005 | Enquist | |
| 6,875,671 B2 | 4/2005 | Farris | |
| 6,881,966 B2 | 4/2005 | Benveniste et al. | |
| 6,884,696 B2 | 4/2005 | Aga et al. | |
| 6,900,115 B2 | 5/2005 | Todd | |
| 6,902,987 B1 | 6/2005 | Tong et al. | |
| 6,903,349 B2 | 6/2005 | Mitchell et al. | |
| 6,905,557 B2 | 6/2005 | Enquist | |
| 6,930,316 B2 | 8/2005 | Nishihashi et al. | |
| 6,956,225 B1 | 10/2005 | Benveniste | |
| 6,962,858 B2 | 11/2005 | Neyret et al. | |
| 6,962,859 B2 | 11/2005 | Todd et al. | |
| 6,987,272 B2 | 1/2006 | Ota et al. | |
| 6,987,572 B2 | 1/2006 | Lakkapragada et al. | |
| 7,019,339 B2 | 3/2006 | Atwater et al. | |
| 7,029,995 B2 | 4/2006 | Todd et al. | |
| 7,205,204 B2 | 4/2007 | Ogawa et al. | |
| 7,371,660 B2 | 5/2008 | Henley et al. | |
| 2001/0024837 A1 | 9/2001 | Streubel | |
| 2002/0029849 A1 | 3/2002 | Ohmi et al. | |
| 2002/0168868 A1 | 11/2002 | Todd | |
| 2002/0173113 A1 | 11/2002 | Todd | |
| 2002/0190269 A1 | 12/2002 | Atwater | |
| 2002/0197831 A1 | 12/2002 | Todd et al. | |
| 2003/0045131 A1 | 3/2003 | Verbeke et al. | |
| 2003/0082300 A1 | 5/2003 | Todd et al. | |
| 2003/0095340 A1 | 5/2003 | Atwater | |
| 2003/0111013 A1 | 6/2003 | Oosterlaken et al. | |
| 2003/0129545 A1 | 7/2003 | Kik | |
| 2003/0216008 A1 | 11/2003 | Schwarzenbach et al. | |
| 2003/0230629 A1 | 12/2003 | Bourianoff | |
| 2003/0230778 A1 | 12/2003 | Park et al. | |
| 2004/0056332 A1 | 3/2004 | Bachrach et al. | |
| 2004/0126985 A1 | 7/2004 | Bendernagel et al. | |
| 2004/0171196 A1 | 9/2004 | Walitzki | |
| 2004/0214434 A1 | 10/2004 | Atwater | |
| 2004/0229444 A1 | 11/2004 | Couillard et al. | |
| 2005/0026400 A1 | 2/2005 | Todd et al. | |
| 2005/0026432 A1 | 2/2005 | Atwater | |
| 2005/0054217 A1 | 3/2005 | Klomp et al. | |
| 2005/0077486 A1 | 4/2005 | Schenkel et al. | |
| 2005/0085049 A1 | 4/2005 | Atwater | |
| 2005/0092235 A1 | 5/2005 | Brabant et al. | |
| 2005/0121627 A1 | 6/2005 | Sheng et al. | |
| 2005/0142879 A1 | 6/2005 | Atwater | |
| 2005/0153524 A1 | 7/2005 | Maa et al. | |
| 2005/0208740 A1 | 9/2005 | Todd | |
| 2005/0247924 A1 | 11/2005 | Atwater | |
| 2005/0250302 A1 | 11/2005 | Todd et al. | |
| 2005/0255670 A1 * | 11/2005 | Couillard et al. | 438/455 |
| 2005/0266658 A1 | 12/2005 | Couillard et al. | |
| 2005/0272222 A1 | 12/2005 | Flamand | |
| 2005/0275067 A1 | 12/2005 | Atwater | |
| 2006/0019464 A1 | 1/2006 | Maa et al. | |
| 2006/0021565 A1 | 2/2006 | Zahler et al. | |
| 2006/0024435 A1 | 2/2006 | Holunga | |
| 2006/0030124 A1 | 2/2006 | Maa et al. | |
| 2006/0060943 A1 | 3/2006 | Mohamed et al. | |
| 2006/0071213 A1 | 4/2006 | Ma et al. | |
| 2006/0088985 A1 | 4/2006 | Haverkort et al. | |
| 2006/0108688 A1 | 5/2006 | Richardson | |
| 2006/0112986 A1 | 6/2006 | Atwater | |
| 2006/0141747 A1 | 6/2006 | Henley | |
| 2007/0026638 A1 * | 2/2007 | Henley | 438/459 |
| 2007/0141802 A1 * | 6/2007 | Gadkaree | 438/455 |
| 2007/0170369 A1 | 7/2007 | Purser et al. | |
| 2007/0194252 A1 | 8/2007 | Horksy et al. | |
| 2008/0160661 A1 * | 7/2008 | Henley | 438/68 |

FOREIGN PATENT DOCUMENTS

| | | |
|---|---|---|
| JP | 11-45840 A | 2/1999 |
| WO | WO 99/08316 | 2/1999 |

OTHER PUBLICATIONS

Agarwal et. al., Efficient Production of Silicon-on-Insulator Films by Co-Implantation of the He+ with H+, Applied Physics, Mar. 2, 1998, Letters, vol. 72, No. 9.

Ahn et al. Stability of Interfacial Oxide Layers during Silicon Wafer Bonding, Journal of Applied Physics, 65(2), Jan. 15, 1989, pp. 561-563.

Ahn et al., Growth, shrinkage, and stability of Interfacial Oxide Layers Between Directly Bonded Silicon Wafers. Appl. Phys A, Jan. 1990, 50 (1), pp. 85-94; Abstract.

Bennett et al., Complete Surface Exfoliation of 4H-SiC by H+—and Si+ Coimplantation, Applied Physics Letters, vol. 76, No. 22, May 29, 2000.

Brendel, A Novel Process for Ultrathin Monocrystalline Silicon Solar Cells on Glass, 14th European Photovoltaic Solar Energy Conference, Jun. 30 to Jul. 4, 1997, Barcelona, Spain.

Brendel, Crystalline Thin-film Silicon Solar Cells from Layer-Transfer Processes: A Review, Proc. 10th Workshop on Crystalline Silicon Solar Cell Materials and Processes, Aug. 13-16, 2000, Copper Mountain, USA, ed. by B.L. Sopori, (NREL, Golden, 2000).

Bourdelle, et al., Fabrication of Directly Bonded Si Substrates with Hybrid Crystal Orientation for Advanced Bulk CMOS Technology, ECS Transactions, 3(4) 409-415 (2006).

Deboer, Low Temperature Epitaxial Silicon Growth Using Electron Cyclotron Resonance Plasma Deposition, Dissertation, Iowa State University, Ames, IA 1995.

Deboer et al., Preparation and Properties of High Quality Crystalline Silicon Films Grown by ECR Plasma Deposition, IEEE, Hawaii, Dec. 5-9, 1994.

Deng et. al., High Efficiency and High Rate Deposited Amorphous Silicon-Based Solar Cells, Phase II, Annual Technical Progress Report, Sep. 1, 2002 to Aug. 31 2003, NREL Subcontract No. NDY-2-30630-08.

De Moor, Technology Development for 3D Integration at IMEC "3D Architectures for Semiconductor Integration and Packaging", Tempe AZ Jun. 13-15, 2005.

Du et. al., Impact of Hydrogen Dilution on Microstructure and Optoelectronic Properties of Silicon Films Deposited using Trisilane, J. Phys D: Appl. Phys. 38 (2005) pp. 838-842.

Duo et al., Comparison Between the Different Implantation Orders in H+ and He+ Coimplantation, Journal of Physics D: Applied Physics, 34, 477-482, 2001.

Ellis Jr., et al. Chemical Vapor Deposition of Boron-Doped Hydrogenated Amorphous Silicon, Appl. Phys. Lett 47 (2) Jul. 15, 1985, p. 135-137.

Feijoo et al. Prestressing of Bonded Wafers. Proceedings of the First International Symposium on Semiconductor Wafer Bonding Science, Technology and Applications, The Electrochemical Society, vol. 92-7, New York, NY 1992.

Fournel, et al., Low Temperature Void Free Hydrophilic or Hydrophobic Silicon Direct Bonding, ECS Transactions, 3(6) 139-146 (2006).

Garrou, 3D Integration: A Status Report "3D Architectures for Semiconductor Integration and Packaging", Tempe AZ Jun. 13-15, 2005.

Gösele, Semiconductor Wafer Bonding: Science Technology and Applications, Electrochemical Society Proceedings, vol. 97-36, pp. 229-248.

Gui et al., The Effect of Surface Roughness on Direct Wafer Bonding, Journal of Applied Physics vol. 85, No. 10, May 15, 1999.

Gui et al., Selective Wafer Bonding by Surface Roughness Control, Journal of the Electrochemical Society, 148 (4), G225-228, 2001.

Hentinnen et al., Cold Ion-Cutting of Hydrogen Implanted Si, Nuclear Instruments and Methods in Physics Research B, 190, 761-766, 2002.

Huang et al., The Lower Boundary of the Hydrogen Concentration Required for Enhancing Oxygen Diffusion and Thermal Donor Formation in Czochralski Silicon, Journal of Applied Physics 98, 033511 (2005).

Huff et al. Silicon Materials Science and Technology, Electrochemical Society Proceedings vol. 98-1, pp. 1385-1394.

Hurley et al., Ion Implantation of Hydrogen and Helium into Silicon Wafers for Layer Transfer in Devices, Vacuum, 78, 167-175, 2005.

International Search Report and the Written Opinion corresponding to the PCT application No. PCT/US07/60801, date of mailing Dec. 6, 2007, 7 pages total.

International Search Report and the Written Opinion corresponding to the PCT application No. PCT/US07/64213, date of mailing Jul. 18, 2008, 8 pages total.

International Search Report and Written Opinion of PCT Application No. PCT/US07/74352, date of mailing Mar. 17, 2008, 14 pages total.

International Search Report and the Written Opinion corresponding to the PCT application No. PCT/US07/65964, date of mailing Jul. 18, 2008, 8 pages total.

International Search Report and Written Opinion of PCT Application No. PCT/US08/078760, date of mailing Dec. 17, 2008, 13 pages total.

Joly, New Wafer to Wafer and Chip to Wafer Device Stacking Technology Implementations "3D Architectures for Semiconductor Integration and Packaging", Tempe AZ Jun. 13-15, 2005.

Kumata et al., Photochemical Vapor Deposition of Hydrogenated Amorphous Silicon Films from Disilane and Trisilane using a Low Pressure Mercury Lamp, Appl. Phys. Lett 48 (20), May 19, 1986, p. 1380.

Lee et al., Strained Silicon Thin-Film Transistors Fabricated on Glass, Applied Physics Letters, 86, 103504, Feb. 2005.

Ling et al., Relationship Between Interfacial Native Oxide Thickness and Bonding Temperature in Directly Bonded Silicon Wafer Pairs, Journal of Applied Physics 71 (3), Feb. 1, 1992, pp. 1237-1241.

Morrison et al., Deposition of Micro-Crystalline Silicon using a Graphite Filament in the Hot Wire CVD Technique, J. Vac. Sci. Technol A19 (6), Nov./Dec. 2001, p. 2817.

Reber et al., Progress in High Temperature Silicon Epitaxy using the RTCVD 160 Processor, presented at the 19th European Solar Energy Conference, Jun. 7-11, 2004, Paris.

Roth et al., "Kinetics of Solid Phase Epitaxy in Thick Amorphous Si Layers formed by MeV Ion Implantation", Appl. Phys. Lett 57 (13), Sep. 24, 1990, p. 1340.

Saraswat, 3-Dimensional ICs: Motivation, Performance Analysis and Technology "3D Architectures for Semiconductor Integration and Packaging", Tempe AZ Jun. 13-15, 2005.

Sarma et al., Silicon-on-Quartz for Low Power Electronic Applications, Proceedings 1994 IEEE International SOI Conference, Oct. 1994.

Shi et al., Characterization of Low-Temperature Processed Single-Crystalline Silicon Thin-Film Transistor on Glass, IEEE Electron Device Letters, vol. 24, No. 9, Sep. 2003.

Stradins et. al., Physics of Solid-Phase Epitaxy of Hydrogenated Amorphous Silicon for Thin Film Si Photovoltaics, Materials Research Society Spring Meeting, San Francisco, 2006.

Takagi et al., Wafer-Scale Room-Temperature Bonding Between Silicon and Ceramic Wafers by Means of Argon-Beam Surface Activation, IEEE, 2001.

Tong et al., Low Temperature Si Layer Splitting, Proceedings 1997 IEEE International SOI Conference, Oct. 1997.

Tung, Chuan-Jong et al, CSDA Ranges of Electrons in Metals, Chinese Journal of Physics, vol. 17, No. 1, Spring 1979.

Venezia et al., The role of implantation damage in the Production of Silicon-On-Insulator Films by Co-Implantation of He+ and H+, Proceedings of the Eighth International Symposium on Silicon Materials Science and Technology, vol. 98-1, 1998.

Voltaix Currents, Responding to Trends in Solar, Voltaix Currents, Spring Newsletter, Apr. 2005.

Walker, 3D Packaging: Density, Design and Decisions "3D Architectures for Semiconductor Integration and Packaging", Tempe AZ Jun. 13-15, 2005.

Wang et al, 17.8% P type Heterojunction Silicon Solar Cells by HWCVD, National Renewable Energy Laboratory, Colorado, PowerPoint Presentation, Spring 2006.

Weldon et al., On the Mechanism of the Hydrogen-Induced Exfoliation of Silicon, J. Vac. Science Tech. B, 15(4), Jul./Aug. 1997.

Weldon et al., Mechanistic Studies of Silicon Wafer Bonding and Layer Exfoliation, Proceedings of the Fourth National Symposium on Semiconductor Wafer Bonding: Science, Technology, and Applications, vol. 97-36, 1998.

Weldon et al., Mechanism of Silicon Exfoliation Induced by Hydrogen/ Helium co-Implantation, Applied Physics Letter, vol. 73, No. 25, Dec. 21, 1998.

Yamazaki et al., Influence of Annealing Ambient on Oxygen Out-Diffusion in Czochralski Silicon, Journal of Applied Physics, vol. 87, No. 9, May 1, 2000, pp. 4194-4197.

* cited by examiner

Glass Substrate

METHOD AND STRUCTURE FOR FABRICATING SOLAR CELLS USING A LAYER TRANSFER PROCESS

CROSS-REFERENCES TO RELATED APPLICATIONS

The instant nonprovisional patent application claims priority to U.S. Provisional Patent Application No. 60/789,730, filed Apr. 5, 2006 and incorporated by reference in its entirety herein for all purposes.

BACKGROUND OF THE INVENTION

Embodiments in accordance with the present invention generally relate to techniques including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human being have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon and/or single crystal silicon materials. These materials are often difficult to manufacture. Polysilicon cells are often formed by manufacturing polysilicon plates. Although these plates may be formed effectively, they do not possess optimum properties for highly effective solar cells. Single crystal silicon has suitable properties for high grade solar cells. Such single crystal silicon is, however, expensive and is also difficult to use for solar applications in an efficient and cost effective manner. Generally, thin-film solar cells are less expensive by using less silicon material but their amorphous or polycrystal structure are less efficient than the more expensive bulk silicon cells made from single-crystal silicon substrates. These and other limitations can be found throughout the present specification and more particularly below.

From the above, it is seen that a technique for manufacturing large substrates which is cost effective and efficient is desirable.

BRIEF SUMMARY OF THE INVENTION

According to embodiments of the present invention, techniques directed to the manufacture of photovoltaic materials are provided. More particularly, the invention provides a technique including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

In a specific embodiment, the present invention provides a method for fabricating a photovoltaic cell, e.g., solar cell, solar panel. Embodiments of the method include providing a reusable substrate having a surface region, a cleave region, and a total thickness of material. In a preferred embodiment, the total thickness of material is at least N times greater than a first thickness of material to be removed, which is between the surface region and the cleave region. The method includes coupling (e.g., Tin Oxide, Indium Tin Oxide (ITO), Titanium Dioxide, Zinc Oxide (ZnO) or other dielectric stack formation material, spin on glass (SOG), or other suitable materials) the surface region of the reusable substrate to a first surface region of an optically transparent substrate, which has the first surface region and a second surface region. The method includes subjecting a voltage differential (e.g., 0.1 Volts to about 100 Volts) between a first region and a second region of the reusable substrate to cause an increase in energy at one or more portions of the cleave region to facilitate removal of the first thickness of material from the reusable substrate. Depending upon the embodiment, the voltage differential is selected to achieve a desired result. In one embodiment, the surface region remains coupled to the first surface region, to form a cleaved surface region coupled to the first surface region of the optically transparent substrate.

In an alternative specific embodiment, the present invention provides a reusable silicon substrate device for use with layer transfer process, e.g., controlled cleaving, process called Smart Cut™ by Soitec, SA. The device includes a reusable substrate having a surface region, a cleave region, and a total thickness of material, which is preferably at least N times greater than a first thickness of material to be removed. The first thickness of material to be removed is between the surface region and the cleave region. In a specific embodiment, N is an integer greater than about ten, but can be others. In a specific embodiment, N can be about 1000 times or greater as compared to a thickness of material being transferred. The device also has a first electrode member coupled to a first region of the reusable substrate and a second electrode member coupled to a second region of the reusable substrate. The device has a voltage source coupled between the first electrode member and the second electrode member to provide a voltage differential between the first region of the cleave region and the second region of the cleave region to cause an increase in energy at one or more portions of the cleave region to facilitate removal of the first thickness of material from the reusable substrate.

In an alternative specific embodiment, the present invention provides a cluster tool apparatus, e.g., multi-chambered. The tool has a first chamber, which has a reusable silicon substrate device for use with layer transfer process. The device has a reusable substrate having a surface region, a cleave region, and a total thickness of material, the total thickness of material being at least N times greater than a first thickness of material to be removed. In a specific embodiment, N can be about 1000 times or greater as compared to a thickness of material being transferred. In a specific embodiment, the first thickness of material to be removed is between the surface region and the cleave region, whereupon N is an integer greater than about ten, but can be others, e.g., one thousand. A first electrode member is coupled to a first region of the reusable substrate. A second electrode member is coupled to a second region of the reusable substrate. In a specific embodiment, the device has a voltage source coupled between the first electrode member and the second electrode member to provide a voltage differential between the first region and the second region to cause an increase in energy at one or more portions of the cleave region to facilitate removal of the first thickness of material from the reusable substrate. In a specific embodiment, cluster tool has a second chamber coupled to the first chamber. The second chamber is provided to perform one or more processes.

In yet an alternative embodiment, the present invention provides a reusable silicon substrate device for use with layer transfer process. The device has a reusable substrate having a surface region, a cleave region, and a total thickness of material. The total thickness of material is at least N times greater than a first thickness of material to be removed. In a specific embodiment, the first thickness of material to be removed is between the surface region and the cleave region, whereupon N is an integer greater than about ten. In a specific embodiment, N can be about 1000 times or greater as compared to a thickness of material being transferred. The device also has a chuck member adapted to hold a handle substrate member in place. The chuck member is configured to hold the handle substrate in a manner to facilitate bonding the handle substrate to the first thickness of material to be removed. In a preferred embodiment, the device has a mechanical pressure device operably coupled to the chuck member. The mechanical pressure device is adapted to provide a force to cause bonding of the handle substrate to the first thickness of material to be removed.

Still further, embodiments in accordance with the present invention provide a method fabricating one or more semiconductor substrates, e.g., silicon on glass. The method includes providing a reusable substrate having a surface region, a cleave region, and a total thickness of material. In a specific embodiment, the total thickness of material is at least N times greater than a first thickness of material to be removed, which is between the surface region and the cleave region. The method also includes subjecting a voltage differential between a first region and a second region of the reusable substrate to cause an increase in energy at one or more portions of the surface region to facilitate bonding of the surface region to a first surface region of a handle substrate.

In still a further embodiment the present invention provides a method fabricating one or more semiconductor substrates, e.g., silicon on glass. The method includes providing a reusable substrate having a surface region, a cleave region, and a total thickness of material. In a specific embodiment, the total thickness of material is at least N times greater than a first thickness of material to be removed, which is between the surface region and the cleave region. The method includes subjecting a voltage differential between a first region and a second region of the reusable substrate to cause an increase in energy at one or more portions of the cleave region to change a characteristic of the cleave region from a first characteristic to a second characteristic. In a specific embodiment, the second characteristic causes removal of the first thickness of material from the reusable substrate.

Numerous benefits may be achieved over pre-existing techniques using the present invention. In particular, embodiments in accordance with the present invention use controlled energy and selected conditions to preferentially cleave a thin photovoltaic film onto a glass substrate according to a specific embodiment. In a specific embodiment, the present method and device provides a very high quality photovoltaic material on glass, which can be used as a portion of the packaging material. In a preferred embodiment, the present method and structure provide for single crystal silicon from a larger reusable bulk substrate member for providing efficient power using photovoltaic cells. In other embodiments, the present method and device provide an efficient technique for large scale manufacturing of solar cells and/or panels. Depending upon the embodiment, one or more of these benefits may be achieved. These and other benefits may be described throughout the present specification and more particularly below.

Embodiments in accordance with the present invention achieve these benefits and others in the context of known process technology. However, a further understanding of the nature and advantages of the present invention may be realized by reference to the latter portions of the specification and attached drawings.

DETAILED DESCRIPTION OF THE INVENTION

Figure 1:
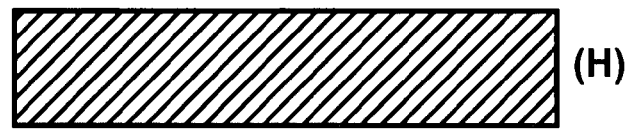
FIGS. 1 through 14 illustrate a method for fabricating a photovoltaic device according to an embodiment of the present invention.

According to embodiments of the present invention, techniques directed to the manufacture of photovoltaic materials are provided. More particularly, embodiments of the present invention provide a technique including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nanotechnology structures, sensors, actuators, integrated circuits, biological and biomedical devices, and the like.

A method of manufacturing a photovoltaic layer on a semiconductor substrate is briefly outlined below.

1. Provide a semiconductor substrate, which has a surface region, a cleave region and a first thickness of material to be removed between the surface region and the cleave region;
2. Align the semiconductor substrate to an optically transparent substrate;
3. Couple the surface region of the semiconductor substrate to a first surface region of the optically transparent substrate using an organic and/or inorganic film (e.g., silicon on glass);
4. Initiate a controlled cleaving action on a portion of the cleave region;
5. Cleave the semiconductor substrate to remove the first thickness of material from the semiconductor substrate, while the surface region remains coupled to the first surface region, to cause formation of a cleaved surface region; and
6. Optionally, form a second thickness of semiconductor material overlying the cleaved surface region to form a resulting thickness of semiconductor material, which has one or more photovoltaic regions;
7. Provide a cover glass material overlying the second thickness of semiconductor material; and
8. Perform other steps, as desired.

The above sequence of steps provides a method according to an embodiment of the present invention. As shown, the technique includes a method and a structure for forming a solar cell structure using layer transfer techniques for photovoltaic applications. Other alternatives can also be provided where steps are added, one or more steps are removed, or one or more steps are provided in a different sequence without departing from the scope of the claims herein. Alternatively, there can be other ways of forming the structure. That is, the sequence can initially be formed on a cover sheet such as cover glass and other suitable materials and then forming the other layers according to a specific embodiment. The layer transfer occurs on the cover glass, which is used to form the rest of the solar cell device. Other techniques can use transfer substrates that will transfer a layer transferred material onto a handle substrate. Further details of the present method can be found throughout the present specification and more particularly below.

As shown in FIG. 1, the method provides a transparent handle substrate, which has a first deflection characteristic, a backside, and a face. The transparent handle substrate can be glass, quartz, polymeric, or other composites, and the like. As merely an example, the transparent substrate has a thickness, a backside surface, and a face. The transparent substrate is glass, such as those used for covering solar cells or the like. Depending upon the embodiment, the glass is somewhat flexible and should be subjected to a backing plate for rigidity. Of course, there can be other variations, modifications, and alternatives.

In alternative embodiments, the handle substrate can be any homogeneous, graded, or multilayered material, or any combination of these. That is, the handle substrate can be made of almost any monocrystalline, polycrystalline, or even amorphous type substrate. Additionally, the substrate can be made of III/V materials such as gallium arsenide, gallium nitride (GaN), and others. Additionally, the substrate can be silicon carbide, germanium, silicon, glass or quartz combinations, plastics, and polymers, which have flexible characteristics. Preferably, the handle substrate has a somewhat flexible characteristic that is unsuitable for a layer transfer process according to a specific embodiment. The unsuitable nature of the substrate causes excessive roughness, breakage, partial film separation, and the like depending upon the specific embodiment. Any other combinations of materials can also be used, depending upon the specific embodiment.

Figure 2:

In one embodiment, the present invention provides a backing substrate to add rigidity to handle substrate structure, as shown in FIG. 2. Preferably, the backing substrate has a thickness and material that is adequate to provide an effective deflection characteristic of a multilayered structure composed of at least the backing substrate and handle substrates to be suitable for a thickness of silicon bearing material from the donor substrate to be transferred onto the face of the handle substrate.

As merely an example, the backing substrate is a silicon wafer for the quartz handle substrate. Such backing substrate has a thickness of 725 microns +/−15 microns and is made of single crystal silicon using, for example, a 200 millimeter donor/handle/backing substrate structures. Such substrate has a Young's modulus of about 130 Giga Pascal. Other types of materials and certain thicknesses such as plastic, metal, glass, quartz, composites, and the like can be used to provide the rigidity to the combined backing and handle substrate structures. Of course, one of ordinary skill in the art would recognize other variations, modifications, and alternatives.

Figure 3:
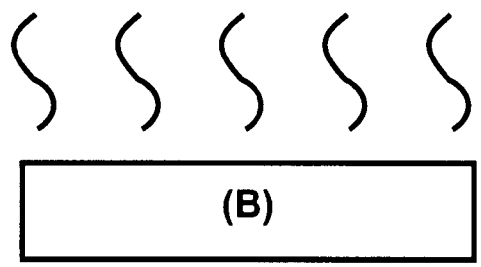
Figure 4:
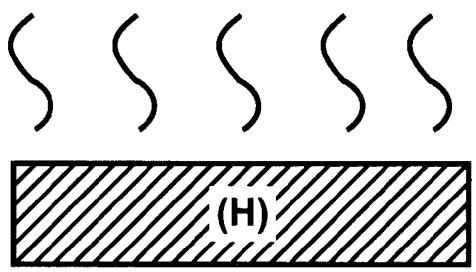

In an optional specific embodiment, the method performs a cleaning and/or activating process (e.g., plasma activated process) on surfaces of the backing and/or transparent handle substrates, as illustrated by FIGS. 3 and 4. Such plasma activating processes clean and/or activate the surfaces of the substrates. The plasma activated processes are provided using an oxygen or nitrogen bearing plasma at 20° C.-40° C. temperature. The plasma activated processes are preferably carried out in dual frequency plasma activation system manufactured by Silicon Genesis Corporation of San Jose, Calif. In still other embodiments, there may not be any backing material. Alternatively in still further embodiments, the present method can use a backing material by way of an electrostatic chuck and/or a porous chuck, and the like. Depending upon the specific embodiment, the present backing material can be provided on either the handle or donor substrate or both the handle and donor substrates. Of course, there can be other variations, modifications, and alternatives.

Figure 5:
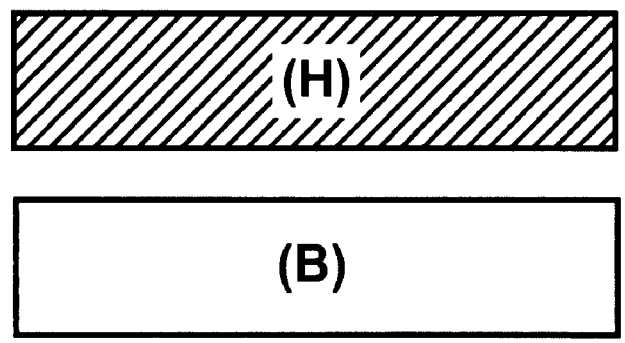
Figure 6:
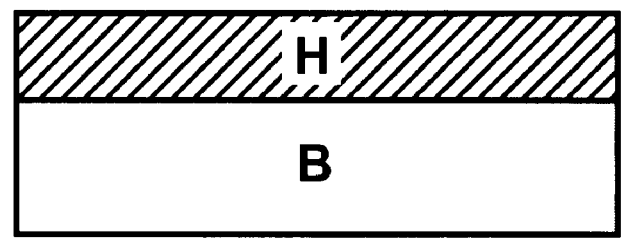

Referring to FIG. 5, the method initiates engagement of the backing substrate to the backside of the transparent handle substrate that is often physically separated from other structures. The method preferably temporarily attaches the backing substrate to the backside of the transparent handle substrate to firmly engage the backing substrate to the transparent handle substrate to form a multilayered structure. As merely an example, the silicon wafer backing substrate firmly attaches to the quartz plate without any other modifications and/or alterations according to a preferred embodiment. Here, the silicon wafer has a very thin coating of native oxide, which bonds to surfaces of the quartz plate, although there may be embodiments without such native oxide, as shown in FIG. 6. In other embodiments, bonding can occur using an electrostatic process or web bonding, including covalent bonding, any combination of these and the like. In yet alternative embodiments, the bonding can also occur using a spin on glass, glue layer, any combination of these, and the like. Of course, there can be other variations, modifications, and alternatives.

Figure 7:
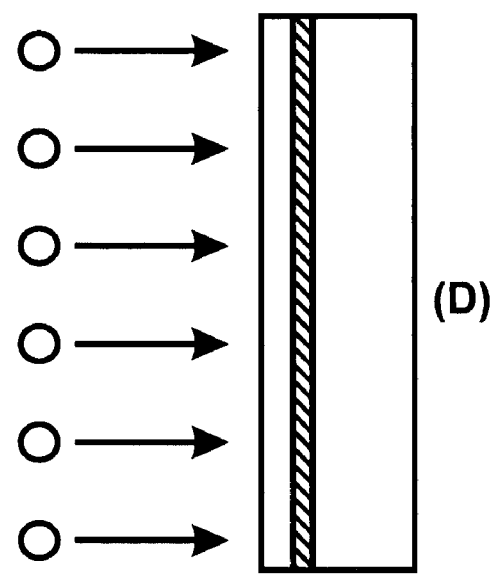

As shown, the method includes providing a donor substrate comprising a cleave region, a face, a backside, and a thickness of silicon bearing material between the face and the cleave region, as shown in FIG. 7. As merely an example, the donor substrate can be a silicon wafer, a germanium wafer, silicon germanium materials, silicon carbide bearing materials, Group III/V compounds, any combination of these, and others. In a preferred embodiment, the donor substrate is made using a photosensitive material. Of course there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. Referring to FIG. 6, the method introduces certain energetic particles using an implant process through a top surface of a donor substrate to a selected depth, which defines a thickness of the material region, termed the "thin film" of material. A variety of techniques can be used to implant the energetic particles into the silicon wafer. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1\times10e15$ to about $1\times10e18$ atoms/cm2, and preferably the dose is greater than about $1\times10e16$ atoms/cm2. Implantation energy ranges from about 1 KeV to about 1 MeV, and is generally about 50 KeV. Implantation temperature ranges from about 20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. A resulting substrate, which has been subject to implant, is illustrated by the simplified diagram of FIG. 7.

Depending upon the embodiment, there may be other techniques for forming a cleave region and/or cleave layer. As merely an example, such cleave region is formed using other processes, such as those called a Nanocleave™ process of Silicon Genesis Corporation of Santa Clara, Calif., a Smart-Cut™ process of Soitec SA of France, and an Eltran™ process of Canon Inc. of Tokyo, Japan, any like processes, and others. Of course, there may be other variations, modifications, and alternatives.

Figure 8:
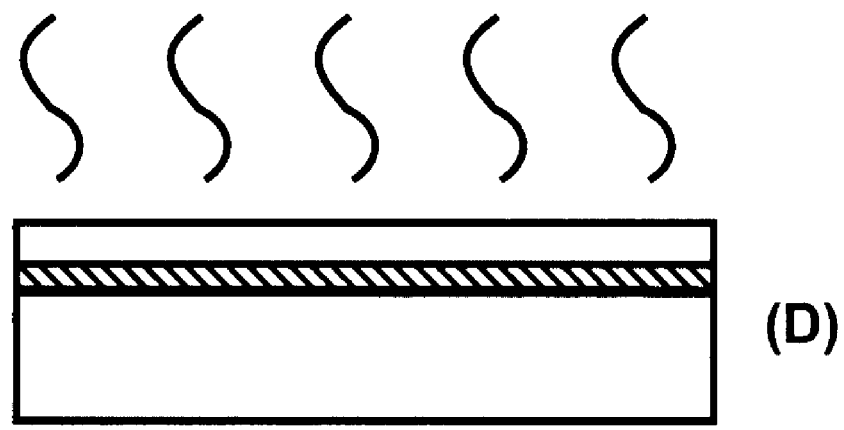

In a specific embodiment, the transparent handle substrate, which has been coupled to the backing, and donor substrate are both subjected to plasma activated processes, as shown in part in FIG. 8. Such plasma activated processes clean and/or activate the surfaces of the substrates. The plasma activated processes are provided using an oxygen or a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Figure 9:
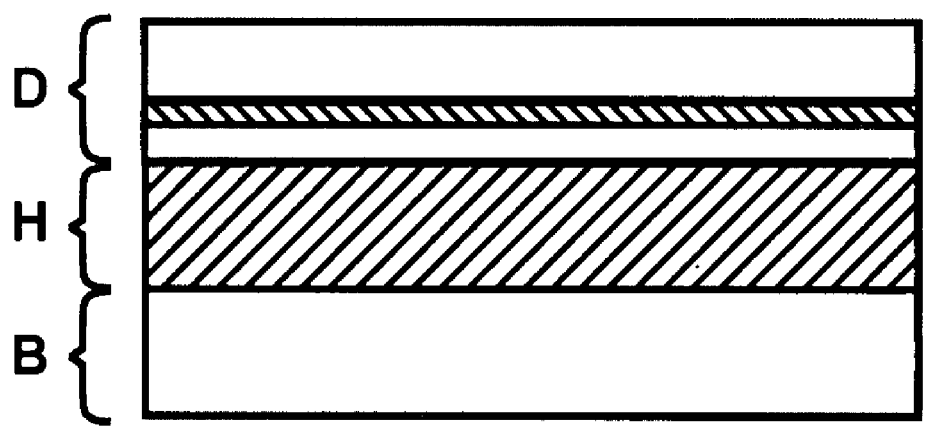

Thereafter, each of these substrates is bonded together, as also illustrated by FIG. 9. As shown, the handle substrate has been bonded to donor wafer. The substrates are preferably bonded using an EVG 850 bonding tool manufactured by Electronic Vision Group or other like processes. Other types of tools such as those manufactured by Karl Suss may also be used. Of course, there can be other variations, modifications, and alternatives. Preferably, bonding between the transparent handle substrate and the donor is substantially permanent and has good reliability.

Accordingly after bonding, the bonded structure is subjected to a bake treatment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for silicon donor substrates and transparent handle substrates. In a specific embodiment, the present bake treatment can occur using a conductive heating process with a hot plate and/or surfaces, which directly couple thermal energy directly from the hot plate to the bonded substrate. In other embodiments, the thermal energy can be provided using radiation, conduction, convection, or any combination of these techniques, and the like. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. Another consideration of this step in combination with the plasma-activation surface treatment is to allow the bond strength to be increased to eliminate de-lamination of the assembly during the same bake treatment step, usually caused by stresses induced by the coefficient of thermal expansion mismatch of the dissimilar materials used. In a specific embodiment, the low temperature bonding process occurs by a self-bonding process. In particular, one wafer is stripped to remove oxidation there from (or one substrate is not oxidized). A cleaning solution treats the surface of the wafer to form O—H bonds on the wafer surface. An example of a solution used to clean the wafer is a mixture of hydrogen peroxide and sulfuric acid, and other like solutions. A dryer dries the wafer surfaces to remove any residual liquids or particles from the substrate surfaces. Self-bonding occurs by placing surfaces of cleaned substrates together.

Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor wafer to the handle substrates. For instance, an electro-static bonding technique can be used to join the two substrates together. In particular, one or both substrate surface(s) is charged to attract to the other substrate surface. Additionally, the donor substrate can be fused to the handle wafer using a variety of other commonly known techniques. In a specific embodiment, the present bonding process to join the donor and handle substrates together can use an in-situ plasma activated bonding process, an in-situ electrostatic bonding process, any combination of these, and the like. Of course, the technique used depends upon the application.

In a preferred embodiment, the method uses an optical coupling material between the two substrates. The optical coupling material is any suitable material that has a refractive index of about 1.8 to about 2.2, but can be others. The material can be selected from Tin Oxide, Indium Tin Oxide (ITO), Zinc Oxide (ZnO), Titanium Dioxide or other dielectric stack formation materials, and the like, including combination of these. Depending upon the embodiment, the material can include one or more layers, and other configurations. Of course, there can be other variations, modifications, and alternatives.

Figure 10:
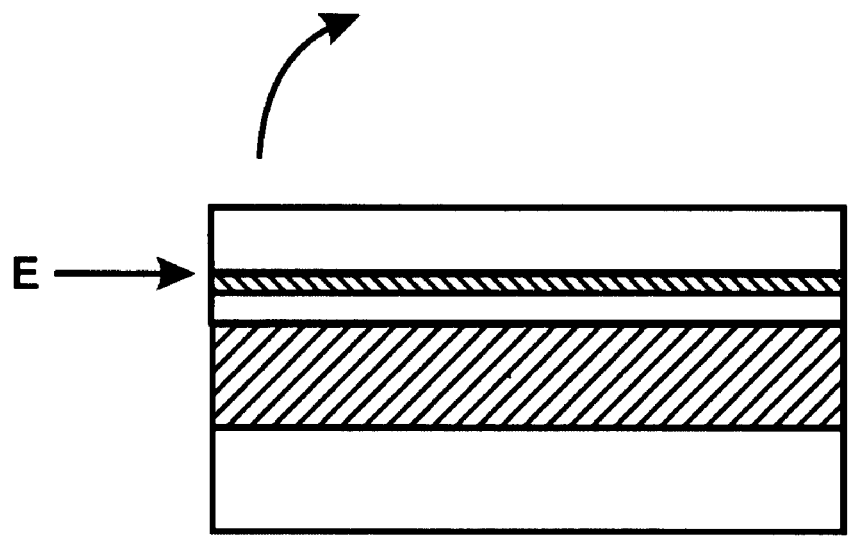
Figure 11:
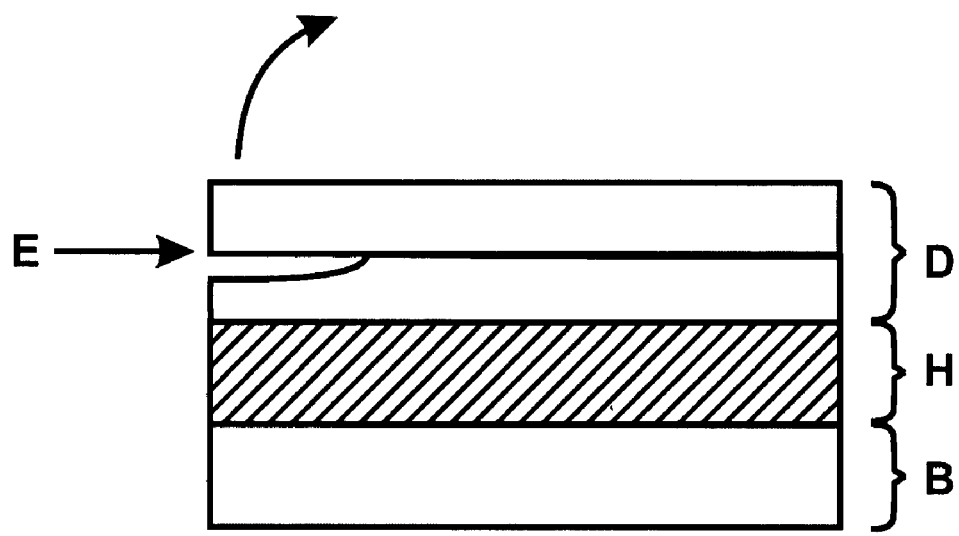
Figure 12:
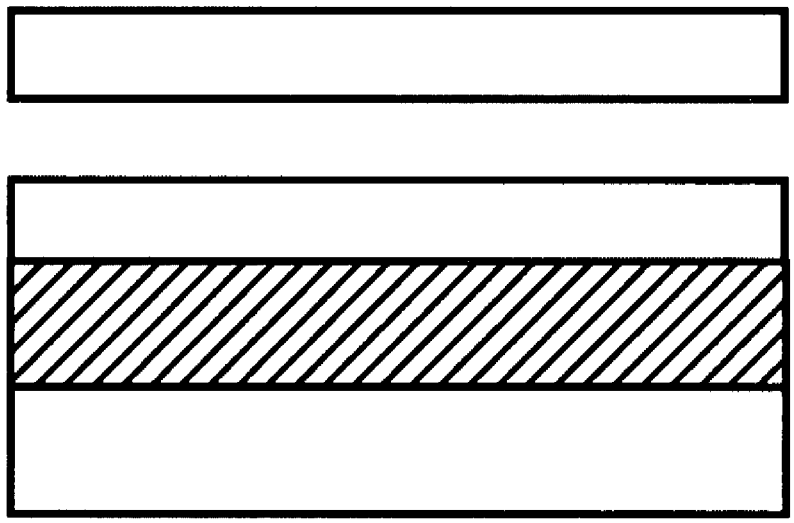

The method performs a controlled cleaving process on the bonded substrate structure, as illustrated by FIGS. 10 and 11. The controlled cleaving process provided a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. Next, the method frees the thickness of material from the donor substrate to completely remove the thickness of material from the donor substrate, as shown by FIG. 12.

Figure 13:
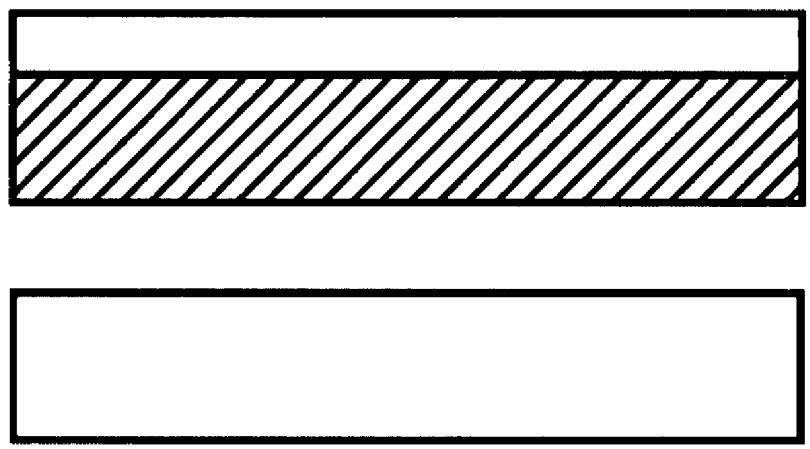

In an embodiment, the method removes the backing substrate from the transparent handle substrate, as illustrated in FIG. 13. In an embodiment, the attachment between the backing substrate and handle substrate is temporary and can be removed with mechanical force without damaging either substrates. In a specific embodiment, a separation process may be used to detaching the backing substrate from the handle substrate. In a specific embodiment, the backing substrate can also be released when the backing substrate member has been provided using an electrostatic, vacuum, or mechanical chuck and/or attachment device. Of course, there can be other variations, modifications, and alternatives.

Figure 14:
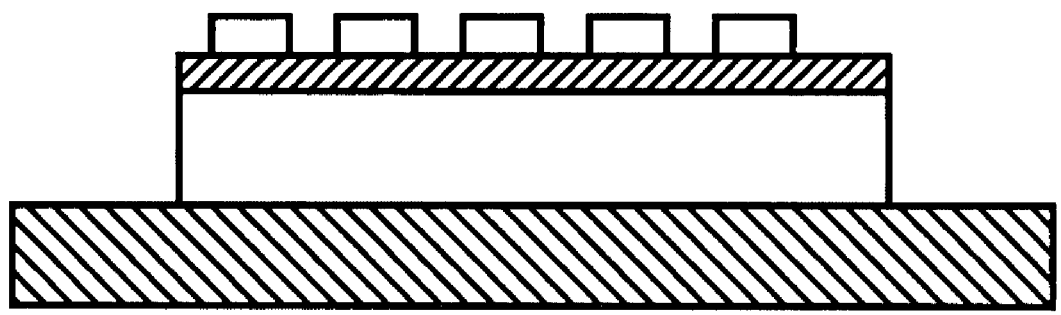

Referring to FIG. 14, the method forms photovoltaic devices onto surfaces of the thickness of material. Such devices can also include integrated semiconductor devices and photovoltaic devices. Such devices can be made using deposition, etching, implantation, photo masking processes, ink jet printing, screen printing, any combination of these, and the like. Of course, there can be other variations, modifications, and alternatives.

In a specific embodiment, the method can also thicken the thickness of transferred material using a deposition process. In a specific embodiment, the method uses a solid phase epitaxial process and/or other forms of deposition processes. The process can form a suitable single crystal silicon or like material according to a specific embodiment. As merely an example, the material can be amorphous silicon, polycrystalline silicon, germanium and silicon germanium alloy. For example, amorphous silicon could advantageously allow for solid-phase epitaxial growth of single-crystal silicon using the underlying transferred silicon film as a template. Another method that can increase the effective rate of silicon material deposition is to spray or coat the surface with silicon nanoparticles (advantageously amorphous silicon) which can be thermally treated to produce single-crystal silicon using the underlying transferred silicon film as a template. This can be applied dry or using a liquid that would be eliminated during subsequent processing. Polycrystalline silicon and other materials may also allow single-crystal re-growth using appropriate treatments such as laser anneals, flash thermal treatments and the like. Of course, there can be other variations, modifications, and alternatives.

In a specific embodiment, the present method includes an etching and/or deposition process (e.g., plasma assisted deposition) for smoothing the cleaved surface region before any step of forming photovoltaic regions and/or forming the thickened layer. The method can use a smoothing process that includes thermal treatment of the cleaved film using a hydrogen and hydrogen chloride containing environment according to a specific embodiment. Alternatively, the etchant can be a chemical bath (e.g., KOH, TMAH) to etch the cleaved film to a predetermined amount. The etching process can be used to remove about 300 to about 800 Angstroms of hydrogen damaged silicon, as an example. In a specific embodiment, the etching process can also be preceded by an oxidation process to convert the hydrogen damaged region into oxide, which is later stripped using a buffered oxide etch and/or other suitable etching species. Of course, there can be other variations, modifications, and alternatives.

In a preferred embodiment, the transferred material is thickened using an amorphous silicon layer. In a preferred embodiment, the amorphous silicon layer is re-crystallized or the like. In a specific embodiment, the amorphous silicon layer is deposited using application of nanoparticles (e.g., amorphous silicon, crystalline silicon, polysilicon, or combinations of these), which are later subjected to a thermal treatment to cause formation of a sheet of thickened material. Alternatively, the amorphous silicon layer can be formed using physical vapor deposition or chemical vapor deposition (e.g., plasma enhanced) at low temperature according to a specific embodiment. In a preferred embodiment, the amorphous silicon layer, which has been deposited overlying a glass material, is maintained at a temperature of less than 500 Degrees Celsius during formation of such silicon layer. In a specific embodiment, the resulting film can be a single crystal and/or polycrystalline structure according to a specific embodiment. In preferred embodiments, the resulting film is single crystalline and has suitable electrical characteristics. Of course, there can be other variations, modifications, and alternatives.

Depending upon the embodiment, the thickened material can be subjected to impurities to form the solar cell structures. In a specific embodiment, the impurities can be in-situ doped, diffused, and/or implanted using ion beams, plasma immersion implantation, ion shower, non-mass separated implantation, substantially or partially non-mass separated, or conventional implantation techniques. These solar cell structures can include impurity regions for P-type and N-type impurities according to a specific embodiment. Of course, there can be other variations, modifications, and alternatives.

In a specific embodiment, the method can also form another layer overlying the thickened layer to form the photovoltaic devices. The other layer can be a semiconductor layer, which can be used to enhance the photovoltaic devices provided for the completed solar cell structure, according to a specific embodiment. In an alternative embodiment, the other layer can be germanium, silicon germanium, II/IV, III/V, any combination of these, and others. The other layer can be used to form another set of photovoltaic regions, which can be coupled to other photovoltaic devices, to enhance the total photovoltaic intensity. Of course, there can be other variations, modifications, and alternatives.

Depending upon the embodiment, the present method and structure can be formed with a specific thickness of the thickened layer and/or combination of the layer transferred layer and thickened layer. In a specific embodiment, the thickened layer can be about 1 micron and 20 microns using a silicon material. In other embodiments, the thickened layer can be less than 1 micron or greater than 20 microns. In other embodiments, the thickened layer can be less than about 50 microns. Of course, there can be other variations, modifications, and alternatives.

Figure 15:
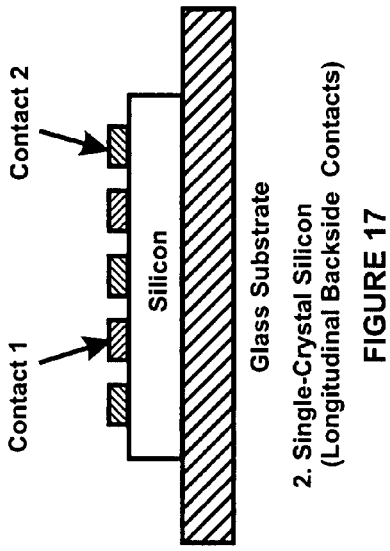
FIGS. 15 to 18 illustrate simplified diagrams of solar cell configurations according to embodiments of present invention.

FIGS. 15 to 18 illustrate simplified diagrams of solar cell configurations according to embodiments of present invention. These diagrams are merely illustrations and should not unduly limit the scope of the claims herein. One of ordinary skill in the art would recognize many variations, modifications, and alternatives. As shown in FIG. 15, a first contact layer is formed sandwiched between a glass substrate and a first surface of a semiconductor layer. In a specific embodiment, the contact layer can be made of a suitable material such as a transparent conductive material, such as ITO and the like. Other materials can also be used. The first contact layer couples to a first electrode structure for a photovoltaic cell, which often comprises a p-n junction or multiple p-n junctions. As merely an example, the semiconductor layer may comprise material such as suitable single crystal silicon and others. A second contact layer is formed overlying a second surface of the semiconductor layer. The second contact layer is arranged in a direction parallel to the first contact layer. In a specific embodiment, the second contact layer is patterned to form a plurality of electrodes, which couple to each of the photovoltaic regions. Each of the electrodes can be configured in parallel and/or series depending upon the specific embodiment. Of course, there can be other variations, modifications, and alternatives.

Figure 16:
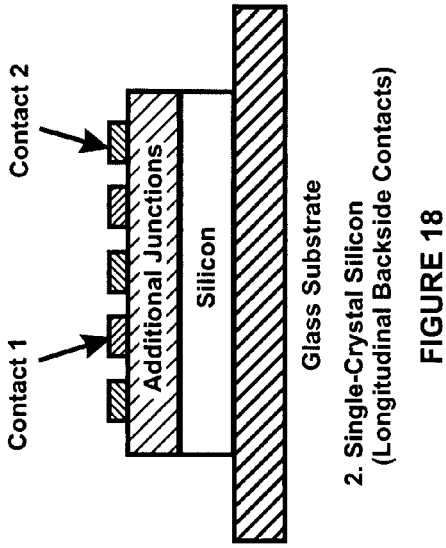
Figure 17:
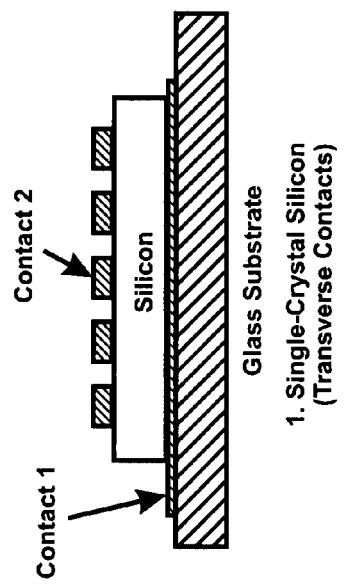

In a specific embodiment, additional junctions can be formed between the second contact layer and the semiconductor substrate to increase efficiency of a solar cell as shown by the simplified diagram of FIG. 16. As shown, the additional junctions are provided on a thickened layer overlying the thickness of single crystal silicon material according to a specific embodiment. The additional junctions can be separate from the photovoltaic devices in the thickness of single crystal silicon. Each of these additional junctions can be configured in parallel and/or series to each other and coupled to the photovoltaic devices in the thickness of silicon material. Of course, there can be other variations, modifications, and alternatives.

Figure 18:
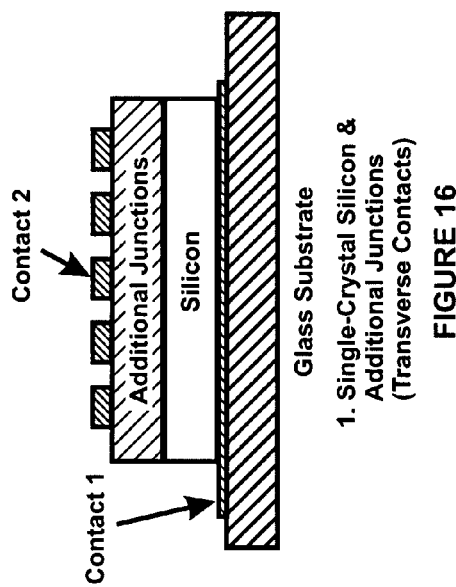

FIG. 18 illustrates yet another example of solar cell configuration according to an embodiment of the present invention. As shown, a glass substrate is attached to a first surface of a semiconductor layer. A first contact structure and a second contact structure are formed overlying a second surface of the semiconductor layer. The first contact structure is configured substantially parallel to the second contact structure. As shown, each of the photovoltaic devices is coupled to at least the first and second contact structures, which are overlying the thickness of single crystal silicon material. Alternatively, additional junctions can be formed between the contact structures and the semiconductor substrate to increase efficiency of the solar cell as shown FIG. 18. Of course there can be other variations, modifications, and alternatives.

Figure 19:
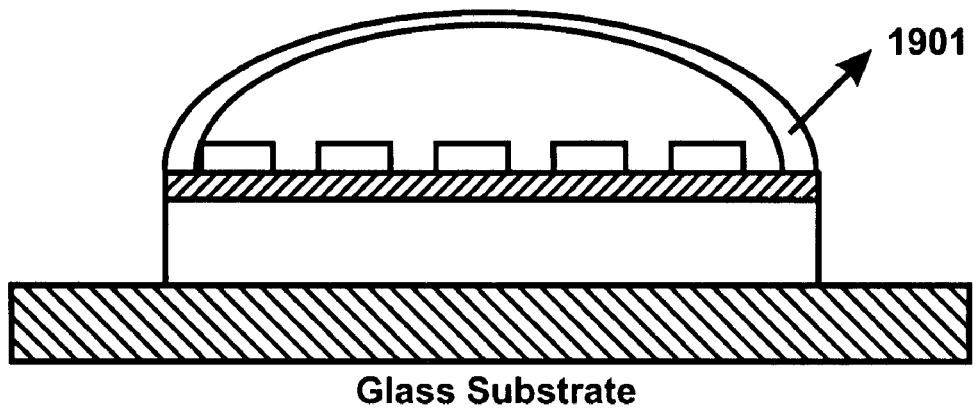
FIG. 19 is a simplified diagram of a solar cell having a reflective surface region according to an embodiment of the present invention.

FIG. 19 is a simplified diagram of a solar cell having a reflective surface region according to an embodiment of the present invention. As shown, a solar cell is provided. The solar cell includes a glass substrate attached to a first surface of a semiconductor layer. A plurality of contact structures are formed overlying a second surface of the semiconductor layer. As shown, each of the photovoltaic devices is coupled to at least the contact structure, which are overlying the thickness of single crystal silicon material. Light traverses through the glass substrate and the photovoltaic devices in the semiconductor layer and converts into electrical energy. As shown, a reflective surface 1901 is provided to reflect any residual light that passes through the photovoltaic regions to further activate one or more of the photovoltaic devices and convert into electrical energy. The reflective surface can be provided using material such as aluminum, silver, gold, or other suitable reflective material. Alternatively, if a non-conductive reflector is desirable, a dielectric stack reflector can be designed alone or in combination with a conductive reflector. The reflective surface provides means for multiple passes of light in the photovoltaic device and increases efficiency of the solar cell. Of course there can be other variations, modifications, and alternatives.

Figure 20:
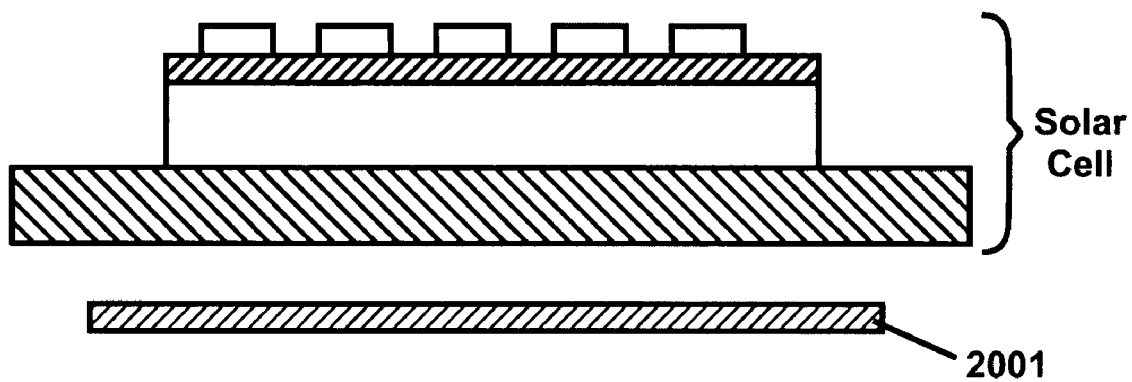
FIG. 20 is a simplified diagram of a solar cell having a lens or light redirection region according to an embodiment of the present invention.

FIG. 20 is a simplified diagram of a solar cell having a lens region according to an embodiment of the present invention. As shown, a solar cell is provided. The solar cell includes a glass substrate attached to a first surface of a semiconductor layer. A plurality of contact structures are formed overlying a second surface of the semiconductor layer. As shown, each of the photovoltaic devices is coupled to at least the contact structure, which are overlying the thickness of single crystal silicon material. Light traverses through the glass substrate and the photovoltaic devices in the semiconductor layer and converts into electrical energy. In a specific embodiment, light is redirected and/or scattered using an optical element 2001 coupled to the glass substrate to direct light in more oblique angles and increase collection efficiency of the solar cell. An example of such an optical element can be a Fresnel lens. The Fresnel lens can be made of a plastic material or glass material. Alternatively, the glass substrate can be modified to scatter or redirect light and function like a Fresnel lens. By modifying the shape of optical element 2001, the light trapping action can occur by total internal reflection as allowed by a waveguide effect within the silicon thin-film or by approximating a Lambertian source and thus increasing the effective thickness of the thin-film cell. These effects can be combined to improved and even optimize the total light conversion efficiency of the cell.

Figure 21:
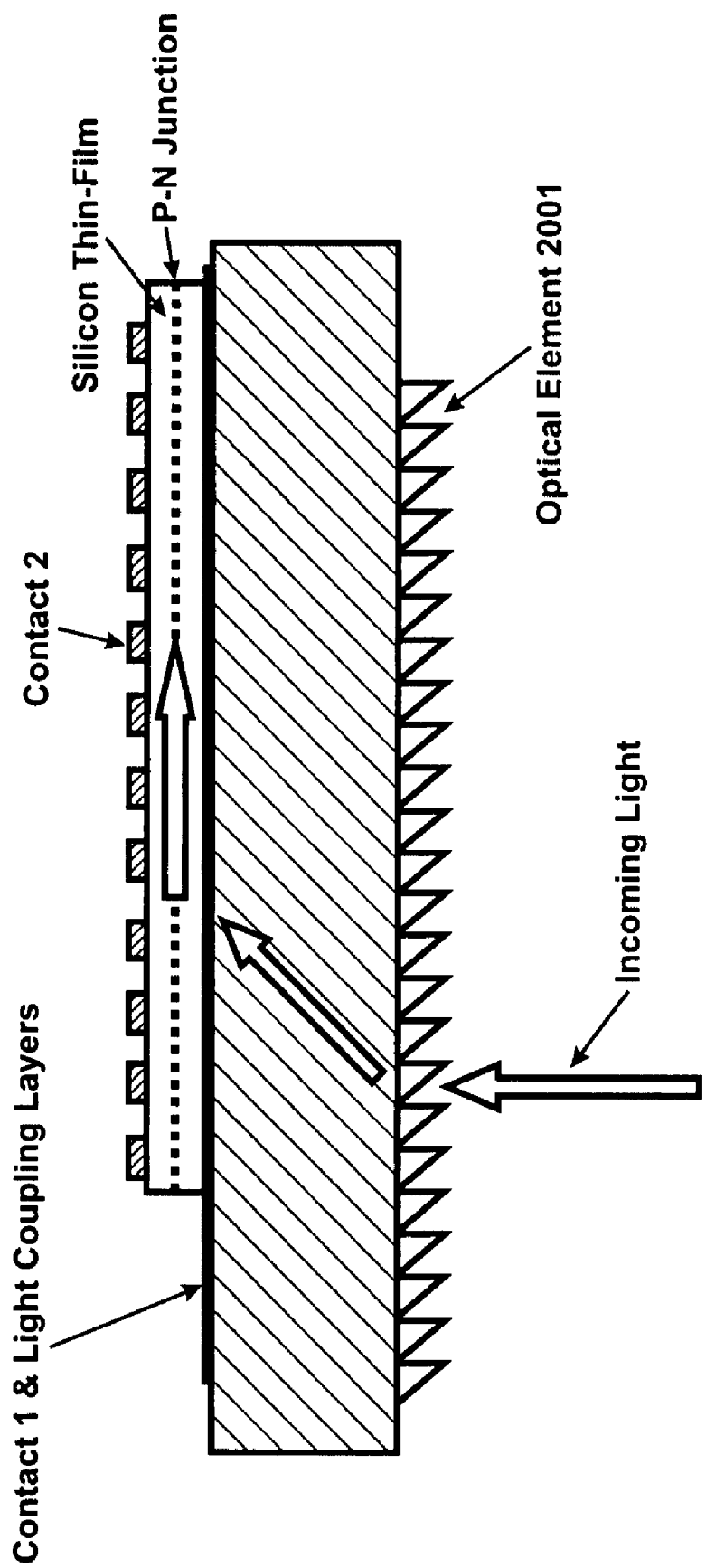
FIG. 21 is a simplified diagram of a solar cell having a light redirection region coupled to a waveguide light trapping mode within the thin-film cell thickness according to an embodiment of the present invention.

FIG. 21 shows a specific embodiment where an optical element is chosen such that the mostly specular light rays are directed at an oblique angle towards the thin-film photovoltaic cell. This diagram is merely an example, which should not unduly limit the scope of the claims herein. One of ordinary skill in the art would recognize other variations, modifications, and alternatives. In a specific embodiment, the thickness of the thin-film is chosen such that the waveguide can not only trap the light impinging at the angle within the glass substrate but supports the propagation within the thin-film for the range of light wavelengths of interest. The design considerations are thus, for all wavelengths of interest (e.g., IR to near-UV which constitutes the largest solar power spectrum wavelength distribution), to allow propagation of transverse electric (TE), transverse Magnetic™, and combination modes and higher order modes within the thickness of the thin-film cell to be allowed to propagate. A suitable dispersion curve for the waveguide to accomplish this design goal would generate the range of allowable silicon thicknesses and select the optical coupling layers that would act as the waveguide cladding. The entrance angle of the light within the transparent substrate would also be a design consideration for correct operation of the system throughout the range of cell entrance angles. Once coupled within the thin-film, the propagation will be highly attenuating due to the absorption of the radiation and its conversion to electricity by generating carriers within the thin-film. The longitudinal propagation of the light coincident with the longitudinal PN junction would help maximize light conversion efficiency. The resulting electric power would be collected by contacts 1 and 2. The structure also allows for light coupling layers that can help lower reflections that can lower the coupled light energy within the active area of the thin-film solar cell. In a specific embodiment, the wave guide can be operable in a multi-mode or single mode. Additionally, the wave can be made using an internal material to cause a difference in refractive index for internal reflection of incoming light according to a specific embodiment. In a preferred embodiment a thin layer of silicon germanium can be sandwiched within a silicon structure to improve and even optimize light confinement to a region (e.g., central region) of one or more photovoltaic regions. Of course there can be other variations, modifications, and alternatives.

Figure 22:
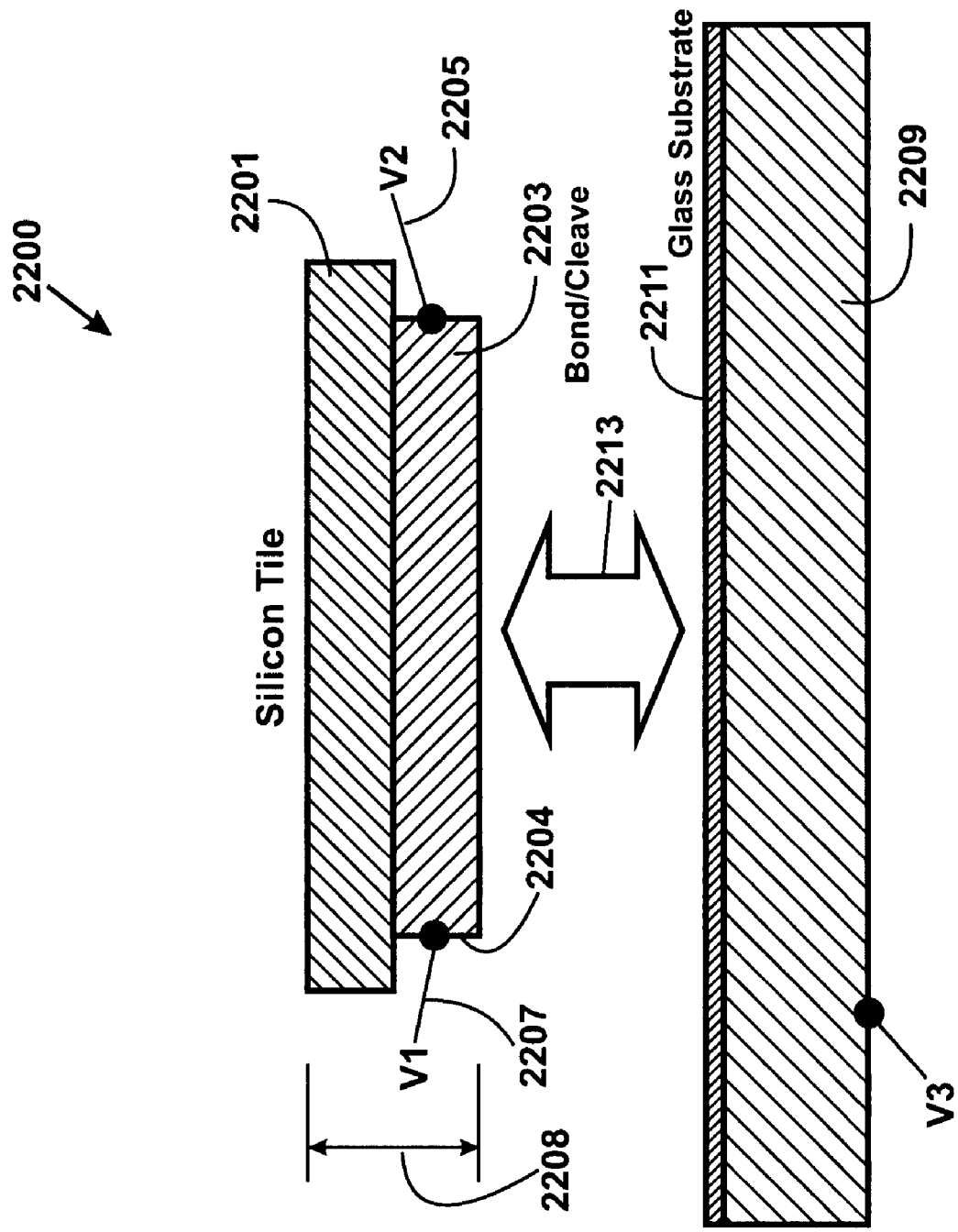
FIG. 22 is a simplified diagram illustrating a method of using a donor substrate as a donor block for layer transfer according to an embodiment of the present invention.

FIG. 22 is a simplified diagram 2200 illustrating a method of using a donor substrate as a donor block for layer transfer according to an embodiment of the present invention. This diagram is merely an example, which should not unduly limit the scope of the claims herein. One of ordinary skill in the art would recognize other variations, modifications, and alternatives. As shown, the present method includes providing a reusable substrate 2201 having a surface region 2203, a cleave region 2204, and a total thickness of material 2208. In a specific embodiment, the total thickness of material is at least N times greater than a first thickness of material to be removed, which is between the surface region and the cleave region.

Depending upon the embodiment, the thickness of material can be composed of a variety of materials. As an example, the material can be silicon, silicon germanium, silicon carbide, any group III/V materials, group II/VI materials, or the like. In a preferred embodiment, the thickness of material is single crystal silicon suitable for solar cell applications. Of course, there can be other variations, modifications, and alternatives.

In a specific embodiment, the method brings 2213 a surface region of the thickness of material toward a handle substrate member 2211. The handle substrate can be any suitable material such as glass, quartz, plastic, any composites, or multilayered materials, and the like. The method includes coupling the surface region of the reusable substrate to a first surface region of an optically transparent substrate, which has first surface region, which will be joined to the thickness of material, and a second surface region 2209. In a specific embodiment, the second surface region is often called an aperture region of the photovoltaic cell or material. Of course, there can be other variations, modifications, and alternatives.

As further shown, the method also includes subjecting a voltage differential between a first region and a second region of the reusable substrate according to a specific embodiment. In a specific embodiment, the voltage differential causes an increase in thermal and/or strain energy at one or more portions of the cleave region to facilitate removal of the first thickness of material from the reusable substrate, while the surface region remains coupled to the first surface region. Of course, there can be other variations, modifications, and alternatives.

In a specific embodiment, the thermal energy will occur by resistive heating due to the resistivity of the substrate structure. In a specific embodiment, thermal heating increases a temperature of the substrate structure. In a preferred embodiment, the substrate is single-crystal silicon and shaped from a 12-inch silicon boule. The substrate size available from the starting boule size can be about 23 centimeters×18 centimeters×1.5 centimeters thickness. Assuming a p+ doped silicon material and the contact being across the long side (23 cm), a resistance of about 0.5 ohms is calculated assuming a resistivity of about 0.5 ohm-cm. As an example, to heat the reusable substrate a current of about 10-100 amperes would develop about 50 watts to 5 kilowatts and would be adjustable to accomplish the desired amount of heating and achieving the desired substrate temperature according to a specific embodiment. The use of an adjustable thermal element can be utilized in various ways during the course of the layer-transfer process.

For example, a pre-bond preparation can utilize a thermal treatment to cure an applied glass layer compound or perform a beta anneal of the hydrogen cleave plane according to "Controlled Cleavage Process and Resulting Device Using Beta Annealing" in the names of Henley, Francois J. and Cheung, Nathan W., issued as U.S. Pat. No. 6,162,705 on Dec. 19, 2000, commonly assigned, and hereby incorporated by reference for all purposes. During a bonding process, the thermal treatment can increase bond strength and further cure and/or optimize the cleave plane. Moreover, the thermal treatment will necessarily generate a thermal gradient in the vertical direction and this can generate strain energies that may also contribute to the cleaving process. These contacts will also serve to set the reusable substrate potential if an electrostatic bond process is used according to a preferred embodiment of the invention. In a specific embodiment, continued use of a thermal treatment during bond can generate a thermally-induced cleaving process instead of a controlled-cleave process. In a preferred embodiment, a controlled cleaving action occurs to remove the thickness of material using a propagating cleave front from one portion of the thickness of material to another portion of the thickness of material. The detached material includes a cleaved surface region coupled to the first surface region of the optically transparent substrate. Of course, there can be other variations, modifications, and alternatives. Further details of the present method can be found throughout the present specification and more particularly below.

In a specific embodiment, the present invention provides a reusable silicon substrate device 2200 for use with layer transfer process, e.g., controlled cleaving, process called Smart Cut™ by Soitec, SA. The device includes a reusable substrate having a surface region, a cleave region, and a total thickness of material, which is preferably at least N times greater than a first thickness of material to be removed. The first thickness of material to be removed is between the surface region and the cleave region. In a specific embodiment, N is an integer greater than about ten, but can be others. The device also has a first electrode 2207 member coupled to a first region of the reusable substrate and a second electrode member 2205 coupled to a second region of the reusable substrate. The device has a voltage source coupled between the first electrode member and the second electrode member to provide a voltage differential between the first region and the second region to cause an increase in thermal and/or strain energy at one or more portions of the cleave region to facilitate removal of the first thickness of material from the reusable substrate. Of course, there can be other variations, modifications, and alternatives. Further details of the present method can be found throughout the present specification and more particularly below.

In the particular embodiment of FIG. 22, a "thick" donor block is used for bonding and cleaving. In accordance with one embodiment, the bond can be made through electrostatic bonding, with the voltage across the block to the glass (V1=V2, V3 at high potential). Heating for bonding treatment can be effectuated with differential voltages V1< >V2, with the current heating the silicon tile for bond treatment (BT). Depending upon the embodiment, the voltage or voltages can be selectively applied on selective spatial portions of the silicon tile. Of course, there can be other variations modifications, and alternatives.

Such use of a thick tile as shown in the embodiment of FIG. 22 confers a number of possible advantages. One advantage is multiple (500× or more) reuses of the tile and the chuck. Such an embodiment also allows for inexpensive re-surfacing, and the use of the Integrated Layer-Transfer Tool (ILT$^2$) concept. Depending upon the embodiment, there may also be other advantages.

A method of manufacturing a photovoltaic layer on a semiconductor substrate is briefly outlined below.

1. Provide a reusable semiconductor substrate, which has a surface region, a cleave region and a first thickness of material to be removed between the surface region and the cleave region;

2. Align the reusable semiconductor substrate to an optically transparent substrate;

4. Form an optical coupling material (e.g., silicon on glass) and/or a bond promotion material on either or both surfaces to be joined on the reusable substrate and the optically transparent substrate;

4. Perform a plasma cleaning process on either or both surfaces to be joined on the reusable substrate and the optically transparent substrate;

5. Couple the surface region of the semiconductor substrate to a first surface region of the optically transparent substrate;

6. Initiate a controlled cleaving action on a portion of the cleave region;

7. Cleave the semiconductor substrate to remove the first thickness of material from the semiconductor substrate, while the surface region remains coupled to the first surface region, to cause formation of a cleaved surface region; and 8. Optionally, form a second thickness of semiconductor material overlying the cleaved surface region to form a resulting thickness of semiconductor material, which has one or more photovoltaic regions;

9. Provide a cover glass material overlying the second thickness of semiconductor material to form a first photovoltaic cell member;

10. Repeat one or more of the above steps using the reusable substrate to form a second photovoltaic cell member;

11. Continue step (10) to form up to N cell members, where N is an integer greater than about 10; and 12. Perform other steps, as desired.

The above sequence of steps provides a method according to an embodiment of the present invention. As shown, the technique includes a method and a structure for forming a solar cell structure using layer transfer techniques for photovoltaic applications. Other alternatives can also be provided where steps are added, one or more steps are removed, or one or more steps are provided in a different sequence without departing from the scope of the claims herein. Alternatively, there can be other ways of forming the structure. That is, the sequence can initially be formed on a cover sheet such as cover glass and other suitable materials and then forming the other layers according to a specific embodiment. The layer transfer occurs on the cover glass, which is used to form the rest of the solar cell device. In preferred embodiments, the layer transferred material is provided from a reusable substrate member. Other techniques can use transfer substrates that will transfer a layer transferred material onto a handle substrate. Further details of the present method can be found throughout the present specification and more particularly below.

Figure 23:
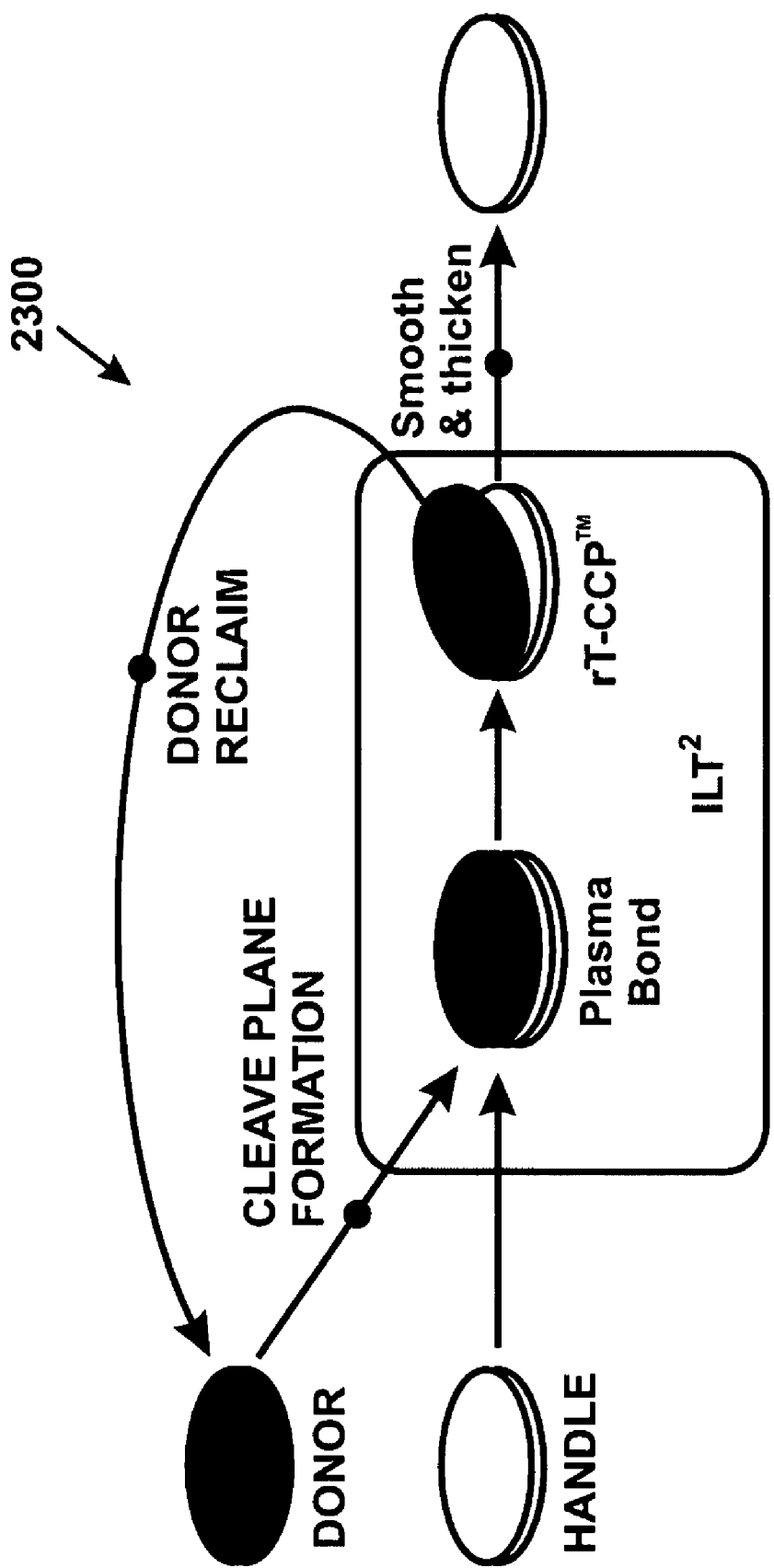
FIG. 23 is a simplified diagram of a method using an integrated layer transfer tool according to an embodiment of the present invention.

FIG. 23 is a simplified diagram of a method 2300 using an integrated layer transfer tool according to an embodiment of the present invention. This diagram is merely an example, which should not unduly limit the scope of the claims herein. One of ordinary skill in the art would recognize other variations, modifications, and alternatives. As shown, the method includes providing a donor substrate and a handle substrate. In a specific embodiment, the donor substrate includes a cleave plane, which is provided by implantation, deposition, or other techniques. In a preferred embodiment, the donor substrate is reusable and can be subject to multiple layer transfer processes.

In a specific embodiment, the method includes using an integrated layer transfer tool to carry out more than one processes to form the photovoltaic cells and/or regions. In a specific embodiment, the tool is provided as a cluster tool, which has a robot arm for inputting and outputting one or more substrates. The cluster tool has an integrated chamber that can perform plasma cleaning, plasma activated bonding, including in-situ bonding, and a controlled cleaving tool, as shown. Other techniques such as electrostatic bonding, curing (e.g., silicon on glass), or other processes can be included. In a specific embodiment, more than one chamber can also be provided to perform these and other functions. In a specific embodiment, the cleaved substrate maintained on the handle substrate is subjected to a deposition process.

In a specific embodiment, the deposition process can be provided to thicken the thickness of transferred material, as also described above. Depending upon the embodiment, the process can include chemical vapor deposition, physical vapor deposition, providing nanoparticles and reflowing them to form epitaxial silicon, any combination of these, and the like. As also shown, the reusable substrate is reclaimed and the method begins again to form another photovoltaic region. Of course, there can be other variations, modifications, and alternatives. Further details of the integrated layer transfer tool can be found throughout the present specification and more particularly below.

Use of embodiments of the Integrated Layer Transfer Tool (ILT$^2$) concept described above may confer certain advantages. A possible advantage of ILT$^2$ is that it may allow the bundling of key steps in layer transfer processes. Specifically, the process module concept may be applied to layer-transfer. In other embodiments, the process module may include other processes as well.

Embodiments of the ILT$^2$ process may also offers lower cost and higher yield layer-transfer. It may allow key bond/cleave steps to occur in a well-controlled environment to eliminate defect-related yield losses. ILT$^2$ may also offer the lowest cost solution compared with single-tool layer-transfer manufacturing. Various features and advantages of the ILT$^2$ process are discussed in further detail below.

Figure 24:
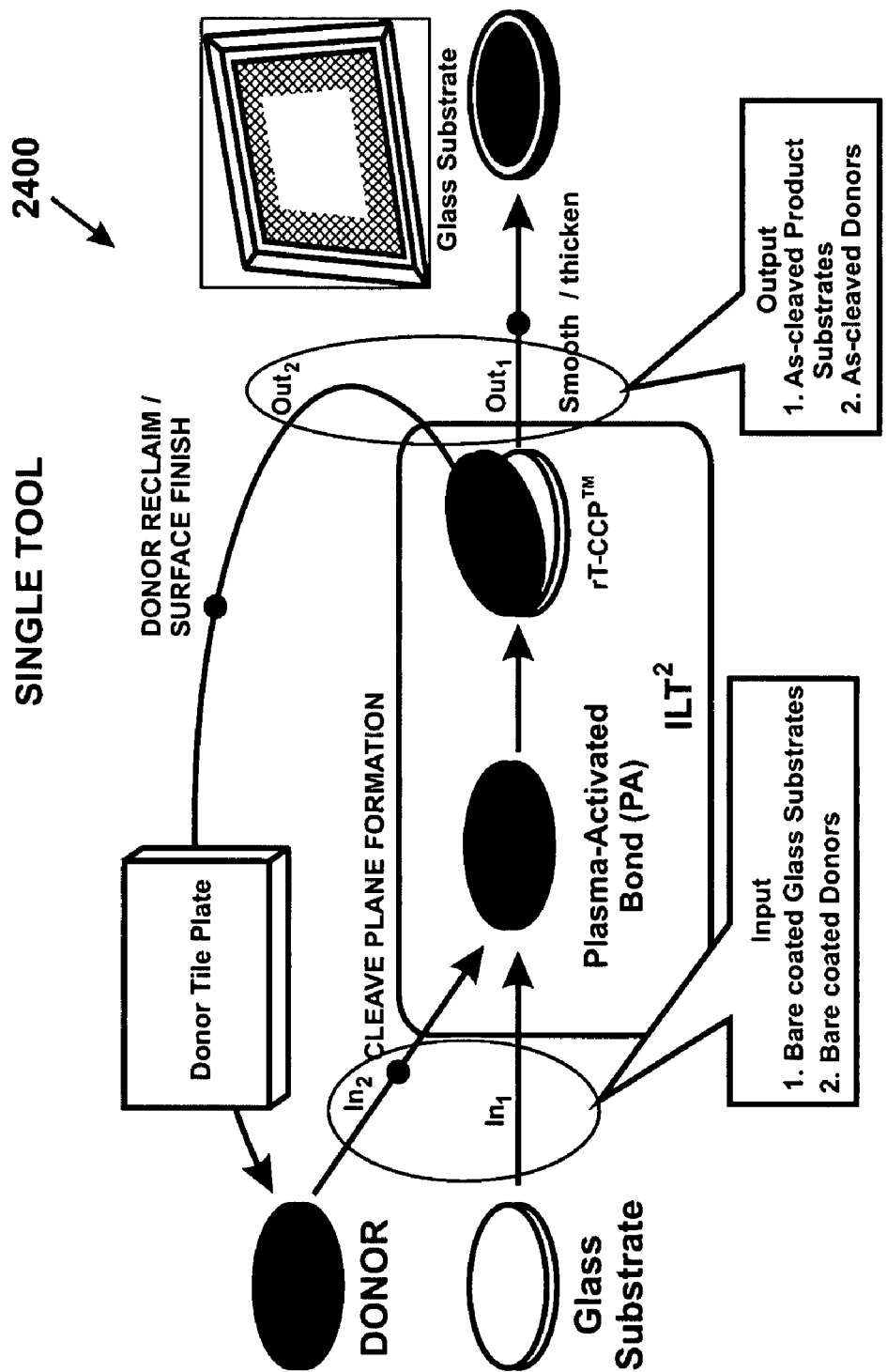
FIG. 24 is a more detailed diagram of a method of using an integrated layer transfer tool according to an embodiment of the present invention.

FIG. 24 is a more detailed diagram of a method 2400 of using an integrated layer transfer tool according to an embodiment of the present invention. This diagram is merely an example, which should not unduly limit the scope of the claims herein. One of ordinary skill in the art would recognize other variations, modifications, and alternatives. In a specific embodiment, the donor substrate includes a cleave plane, which is provided by implantation, deposition, or other techniques. In a preferred embodiment, the donor substrate is reusable and can be subject to multiple layer transfer processes. In a more preferred embodiment, the reusable silicon substrate device 2401 is for use with more than one layer transfer processes simultaneously.

In a specific embodiment, the reusable device has a donor substrate member, which has a plurality of sites. The device also has a plurality of reusable substrates arranged respectively on the plurality of sites. In a specific embodiment, each of the reusable substrates has a surface region, a cleave region, and a total thickness of material. In a preferred embodiment, the total thickness of material is at least N times greater than a first thickness of material to be removed. The first thickness of material to be removed is between the surface region and the cleave region, whereupon N is an integer greater than about ten. Of course, there can be other variations, modifications, and alternatives.

In a specific embodiment, the method includes using an integrated layer transfer tool to carry out more than one processes to form the photovoltaic cells and/or regions. In a specific embodiment, the tool is provided as a cluster tool, which has a robot arm for inputting and outputting one or more substrates. The cluster tool has an integrated chamber that can perform the formation of an bond promotion or accommodation layer onto the one or both surfaces to be bonded (using SOG-like organic or inorganic materials or the like), plasma activated and/or electro-static bonding, including in-situ bonding, and a controlled cleaving tool, as shown. In a specific embodiment, more than one chamber can also be provided to perform these and other functions. In a specific embodiment, the cleaved substrate maintained on the handle substrate is subjected to a deposition process.

In a specific embodiment, the deposition process can be provided to thicken the thickness of transferred material, as also described above. Depending upon the embodiment, the process can include chemical vapor deposition, physical vapor deposition, providing nanoparticles and reflowing them to form epitaxial silicon, any combination of these, and the like. As also shown, the reusable substrate is reclaimed and the method begins again to form another photovoltaic region. Of course, there can be other variations, modifications, and alternatives. Further details of the integrated layer transfer tool can be found throughout the present specification and more particularly below.

Other equipment may be employed in conjunction with the bonding tool discussed above. For example, an ion shower system (Gen 4 glass) may be used to form the cleave plane. Other forms of implantation such as plasma immersion ion implantation, plasma implantation, or the like can also be used. CMP tools may be used for smoothening and to reclaim the donor. Chemical treatment tools can also be used in combination. Ion-beam assisted deposition tools may be utilized for thickening. Of course, there can be other variations, modifications, and alternatives.

Figure 25:
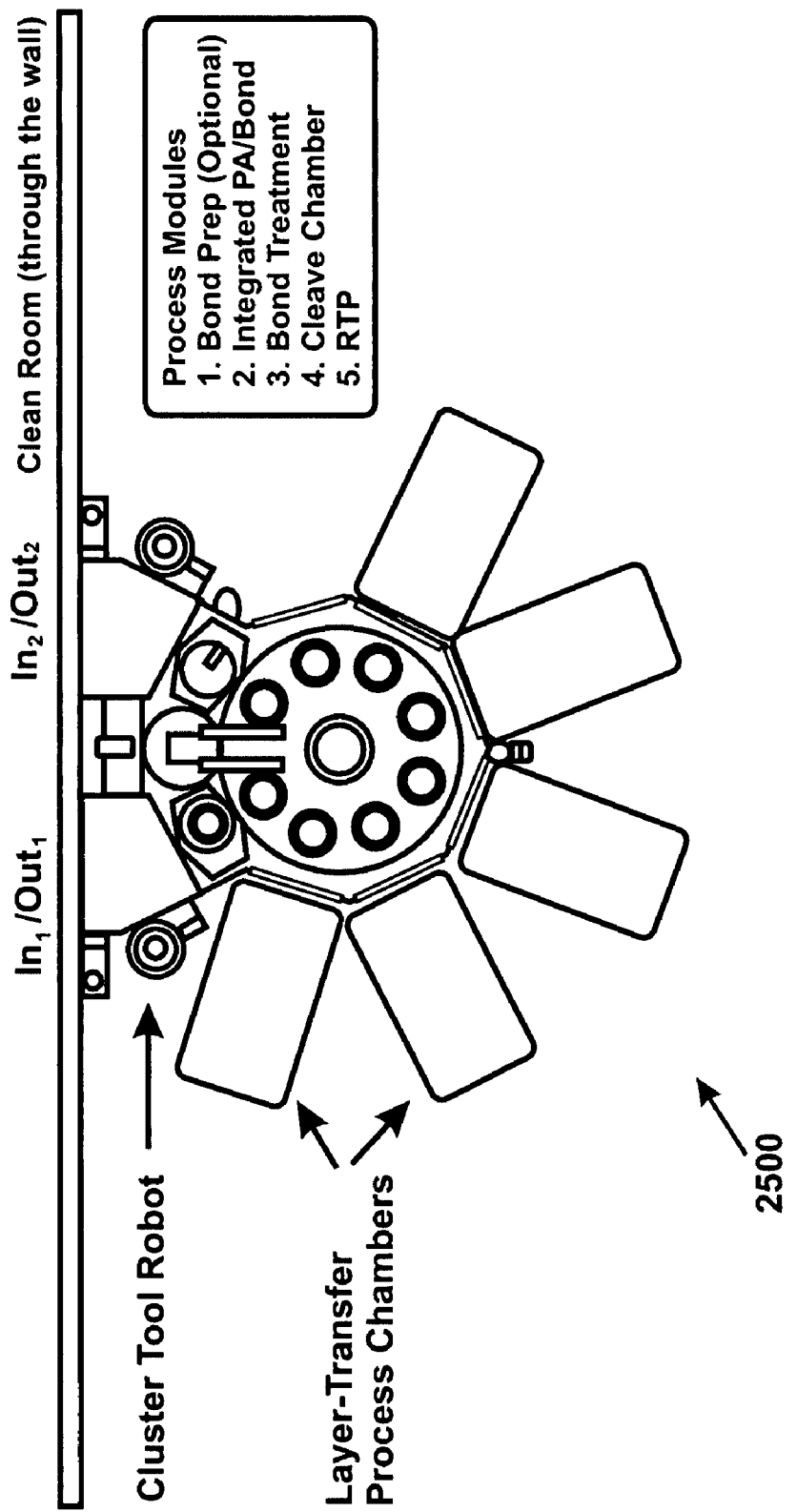
FIG. 25 is a top-view diagram of a cluster tool for layer transfer according to an embodiment of the present invention.

FIG. 25 is a top-view diagram of a cluster tool 2500 for layer transfer according to an embodiment of the present invention. This diagram is merely an example, which should not unduly limit the scope of the claims herein. One of ordinary skill in the art would recognize other variations, modifications, and alternatives. As shown, a cluster tool apparatus, e.g., multi-chambered, is provided. The tool has a first chamber (1), which has a reusable silicon substrate device for use with layer transfer process. The device has a reusable substrate having a surface region, a cleave region, and a total thickness of material, the total thickness of material being at least N times greater than a first thickness of material to be removed. In a specific embodiment, the first thickness of material to be removed is between the surface region and the cleave region, whereupon N is an integer greater than about ten. A first electrode member is coupled to a first region of the reusable substrate, e.g., cleave region, other region. A second electrode member is coupled to a second region of the reusable substrate, e.g., cleave region or other region. In a specific embodiment, the device has a voltage source coupled between the first electrode member and the second electrode member to provide a voltage differential between the first region and the second region to cause an increase in thermal and/or strain energy at one or more portions of the cleave region to facilitate removal of the first thickness of material from the reusable substrate.

In a specific embodiment, cluster tool has a second chamber (2) coupled to the first chamber. The second chamber is provided to perform one or more processes. Depending upon the embodiment, the second chamber can be adapted to perform preparation for bonding, e.g., formation of a layer that enhances bond quality, thermal anneal and/or etching, smoothing. Additionally, the second chamber can be adapted to perform plasma activation and bonding according to a specific embodiment. Other chambers can be provided to perform bond treatment, cleaving, implantation, deposition, etching, and other processes. Depending upon the embodiment, the chambers can be configured in a parallel and/or serial manner. Of course, there can be other variations, modifications, and alternatives.

The apparatus shown in FIG. 25 allows the bundling of key layer-transfer processes, permitting the process module concept to be applied to layer-transfer. Process modules run on the cluster tool can include, but are not limited to, (optional) bonding preparation, integrated plasma activation (PA)/bonding, bond treatment, cleaving, and rapid thermal processing (RTP).

Figure 26:
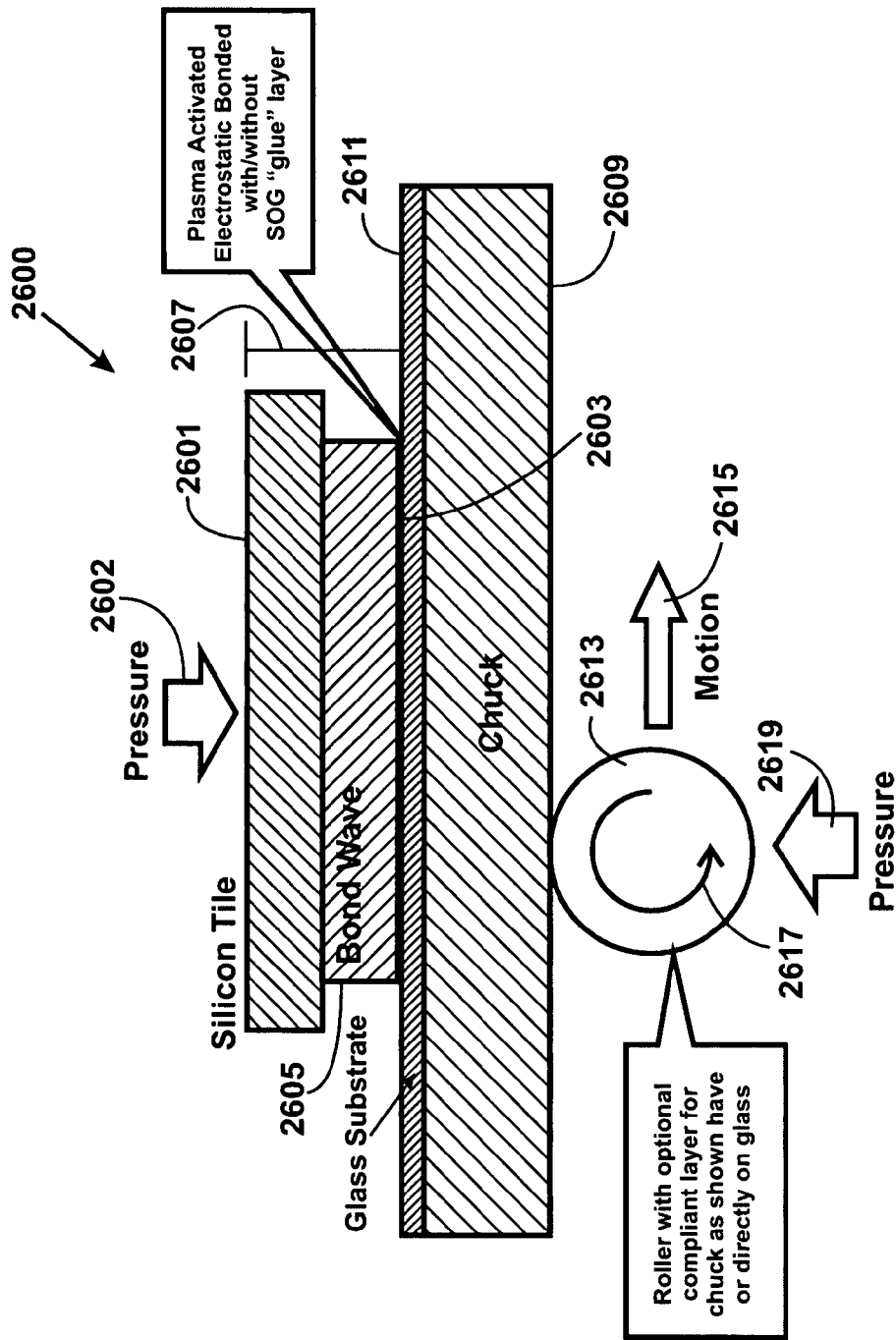
FIG. 26 is a simplified diagram illustrating an alternative method of using a donor substrate according to an embodiment of the present invention.

FIG. 26 is a simplified diagram 2600 illustrating an alternative method of using a donor substrate according to an embodiment of the present invention. This diagram is merely an example, which should not unduly limit the scope of the claims herein. One of ordinary skill in the art would recognize other variations, modifications, and alternatives. As shown, a reusable silicon substrate device for use with layer transfer process is provided. The device has a reusable substrate 2601 having a surface region 2603, a cleave region 2605, and a total thickness of material 2607. The total thickness of material is at least N times greater than a first thickness of material to be removed. In a specific embodiment, the first thickness of material to be removed is between the surface region and the cleave region, whereupon N is an integer greater than about ten. In other embodiments, N can be other integers. Of course, there can be other variations, modifications, and alternatives.

In a specific embodiment, the device also has a chuck member 2609 adapted to hold a handle substrate member 2611 in place. In a specific embodiment, the handle substrate can be made of any suitable material such as those noted herein, such as glass, quartz, or plastic, including other combinations, and the like. The chuck member is configured to hold the handle substrate in a manner to facilitate bonding the handle substrate to the first thickness of material to be removed. In a specific embodiment, the chuck member can be a mechanical chuck, electrostatic chuck, or vacuum chuck. Of course, there can be other variations, modifications, and alternatives.

In a specific embodiment, the reusable substrate is provided on a movable head device. The head device can be adapted to provide pressure 2602 in a z-direction to cause the surface of the reusable substrate to be applied to the handle substrate according to a specific embodiment. The head device can also move in a lateral y and x direction according to a specific embodiment. The head device is also adapted to be able to tilt relative to the z-direction to facility cleaving of the thickness of material. Alternatively, the chuck device, which will be described in more detail below, is provided to tilt relative to the z-direction. Of course, there can be other variations, modifications, and alternatives.

In a preferred embodiment, the device has a mechanical pressure device 2613 operably coupled to the chuck member. The mechanical pressure device is adapted to provide a force 2619 to cause bonding of the handle substrate to the first thickness of material to be removed. In a specific embodiment, the chuck member is a rigid cylindrical roller member, which can be rotated 2617 about an axis and moved laterally 2615. Alternative members such as other annular members, rollers, and any other suitable shapes, sizes, and rigidity can also be used. Of course, there can be other variations, modifications, and alternatives. Further details of other methods and systems according to embodiments of the present invention can be found throughout the present specification and more particularly below.

Figure 27:
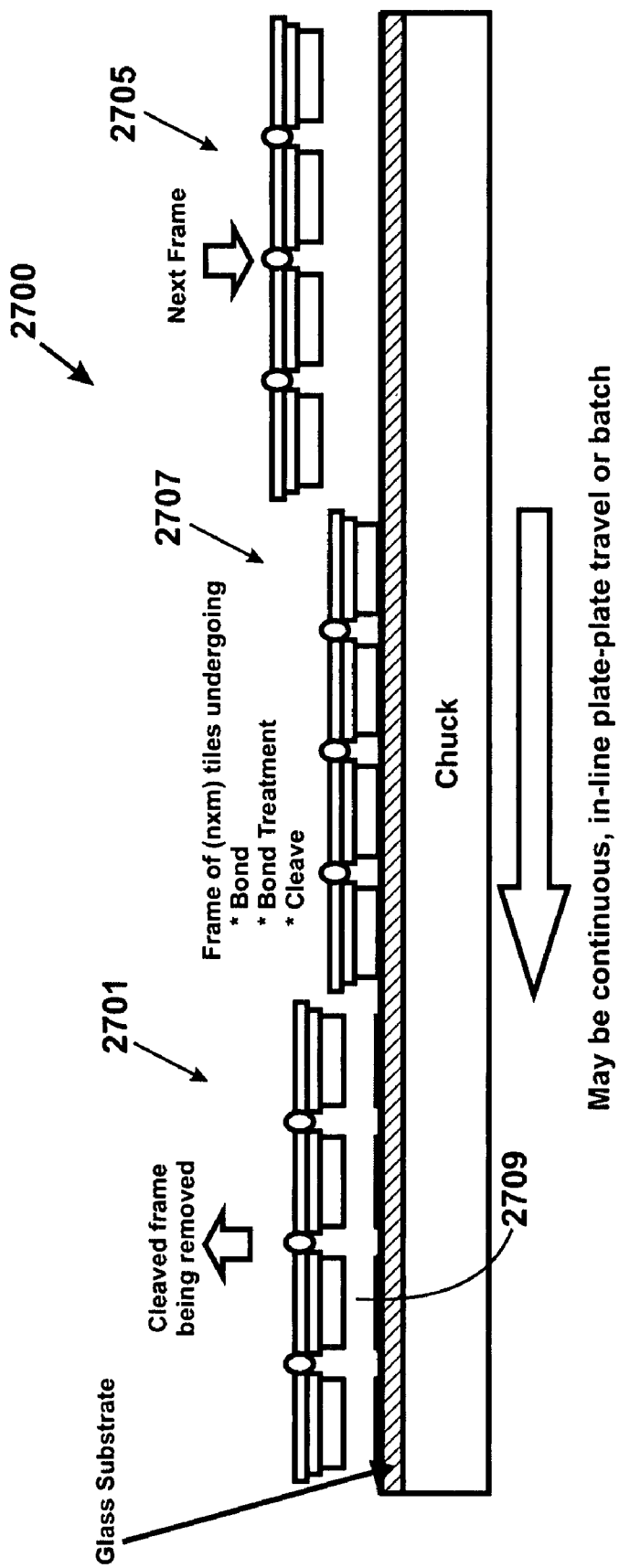
FIG. 27 is a simplified diagram illustrating yet an alternative method of using a donor substrate according to an embodiment of the present invention.

FIG. 27 is a simplified diagram 2700 illustrating yet an alternative method of using a donor substrate according to an embodiment of the present invention. This diagram is merely an example, which should not unduly limit the scope of the claims herein. One of ordinary skill in the art would recognize other variations, modifications, and alternatives. As shown, the present invention provides use of a plurality of reusable substrates on a larger frame and/or support member 2701 according to a specific embodiment. In a specific embodiment, the frame and/or support member includes a plurality of reusable substrates 2705. Each of the substrates includes a cleave region, surface region, and thickness of material to be removed.

In a specific embodiment, the plurality of reusable substrates are bonded 2707 to a handle substrate, which is held by a chuck member. Depending upon the embodiment, the bonding process can include a plasma activation and/or an electrostatic bonding process, joining process, bond treatment process, and others. In a specific embodiment, the joined plurality of reusable substrates are subjected to a cleaving process. The cleaving process can be a process called the Controlled Cleaving Process™ by Silicon Genesis Corporation, a process called Smart Cut™ by Soitec SA, or others depending upon the specific embodiment. Once cleaving has occurred, the plurality of reusable substrates, which have removed thicknesses of materials, are removed for a next sequence of process steps. Of course, there can be other variations, modifications, and alternatives.

In the specific embodiment of FIG. 27, tiles can be 1, 2, or more deep. Re-surfacing may be accomplished by chemical mechanical planarization. The cleave plane may be formed by ion shower or the like. Optional bond preparation treatment includes coating, etc. The steps may be performed on a tray-like frame that that allows numerous tiles to be simultaneously bonded and cleaved. In accordance with other embodiments, the detached portions can be secured in place by other than physical contact with a common tray, for example by application of a positive gas pressure. Bonding can be through plasma, electro-static, coating enhanced, or a combination of these processes. Bond treatment: heat conduction, current heating etc., may be done in combination with continuing electro-static bond treatment. Cleaving may be achieved by CCP or thermal-based approaches. The processing may be continuous, in-line plate-plate travel, or batch.

Figure 28:
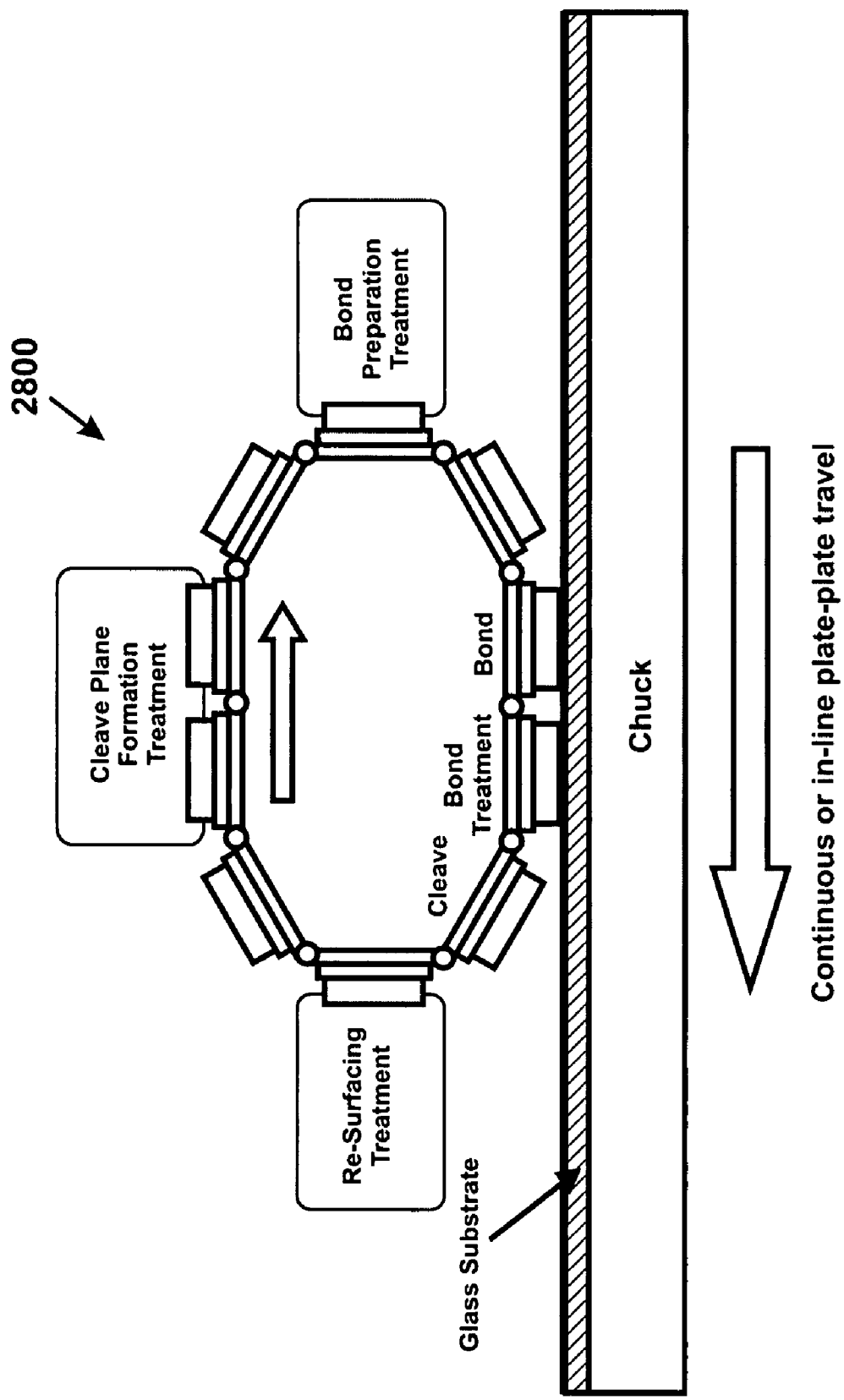
FIG. 28 is a simplified diagram illustrating still an alternative method of using a donor substrate according to an embodiment of the present invention.

FIG. 28 is a simplified diagram 2800 illustrating still an alternative method of using a donor substrate according to an embodiment of the present invention. This diagram is merely an example, which should not unduly limit the scope of the claims herein. One of ordinary skill in the art would recognize other variations, modifications, and alternatives. As shown, the diagram includes a plurality of reusable substrate members provided in a track-like configuration, which is provided merely for illustration purposes, according to a specific embodiment. Each of the substrates is subjected to a sequence for fabricating a solar cell member or other substrate member according to a specific embodiment. As merely an example, the substrates are provided for cleave plane formation, which uses implantation and/or other techniques according to a specific embodiment. After that, the method uses a bond preparation treatment process such as the formation of a bond promotion layer according to a specific embodiment. The method then performs bonding, bond treatment, and cleaving according to a specific embodiment. The cleaved reusable substrate is subjected to resurfacing, which facilitates the next sequence of steps according to a specific embodiment.

As also shown, the plurality of substrates are provided on a handle substrate, which is maintained on a chuck member. In a specific embodiment, the chuck member can be movable in a continuous manner along a predetermined direction to perform the present method. As the chuck member moves the handle substrate, each of the reusable substrates is subjected to the chuck member in a continuous assembly-like manner. Of course, there can be other variations, modifications, and alternatives.

In a specific embodiment, each of the substrate members can be selectively designed for layer transfer processes. As an example, an edge of the thickness of material can be formed and/or beveled such that a mechanical blade and/or member can be provided within a vicinity of the cleave region to initiate cleaving of the thickness of material from the remaining portion of the reusable substrate member. That is, a blade can be inserted within the vicinity of the cleave region within an outer portion of the substrates to initiate cleaving and energy is provided to either one or both of the substrates to continue the propagation of the cleave front and remove the thickness of material from the remaining portion of the reusable substrate member. In other embodiments, the cleave region can include an exclusion region around its periphery to facilitate bonding and cleaving. Such exclusion region can be formed using a mask and/or blocking material when implanting particles (e.g., hydrogen) into the cleave region to form the cleave region according to a specific embodiment. Of course, there can be other variations, modifications, and alternatives.

In the specific embodiment of FIG. 28, tiles can be 1, 2, or more deep. Re-surfacing may be accomplished by chemical mechanical planarization. The cleave plane may be formed by ion shower or the like. Optional bond preparation treatment includes coating, etc. The steps may be performed on a tray-like frame that that allows numerous tiles to be simultaneously bonded and cleaved. Bonding can be through plasma, electro-static, coating enhanced, or a combination of these processes. Bond treatment: heat conduction, current heating etc., may be done in combination with continuing electro-static bond treatment. Cleaving may be achieved by CCP or thermal-based approaches. The processing may be continuous, in-line plate-plate travel, or batch.

Figure 29:
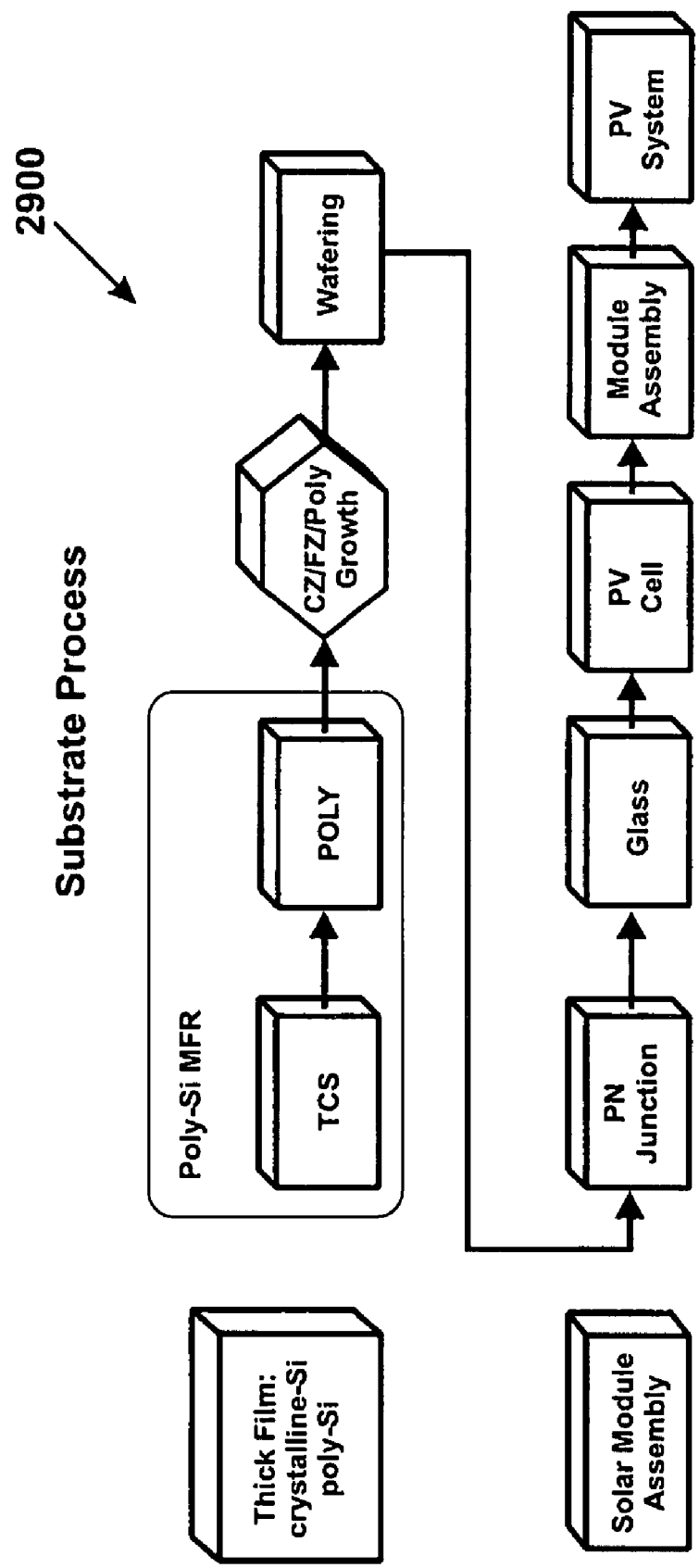
FIG. 29 is a conventional process for forming conventional photovoltaic cells.

FIG. 29 is a conventional process 2900 for forming conventional photovoltaic cells. As shown, the conventional process includes a process of using gaseous species (e.g., trichlorosilane) to form polysilicon material. The polysilicon material is then made into one or more bulk substrate members. Such bulk substrate members are subjected to wafer processes such as grinding, polishing, and cutting, and others. To complete the solar cell, the wafer undergoes formation of photovoltaic cell regions, application of cover glass, and other processes. The final assembly is provided into a module, which is then formed into a system to be used. As shown, the conventional process is highly difficult to perform, costly, and prone to defects. These and other limitations have been overcome by the present method, which has been described throughout the present specification and more particularly below.

Figure 30:
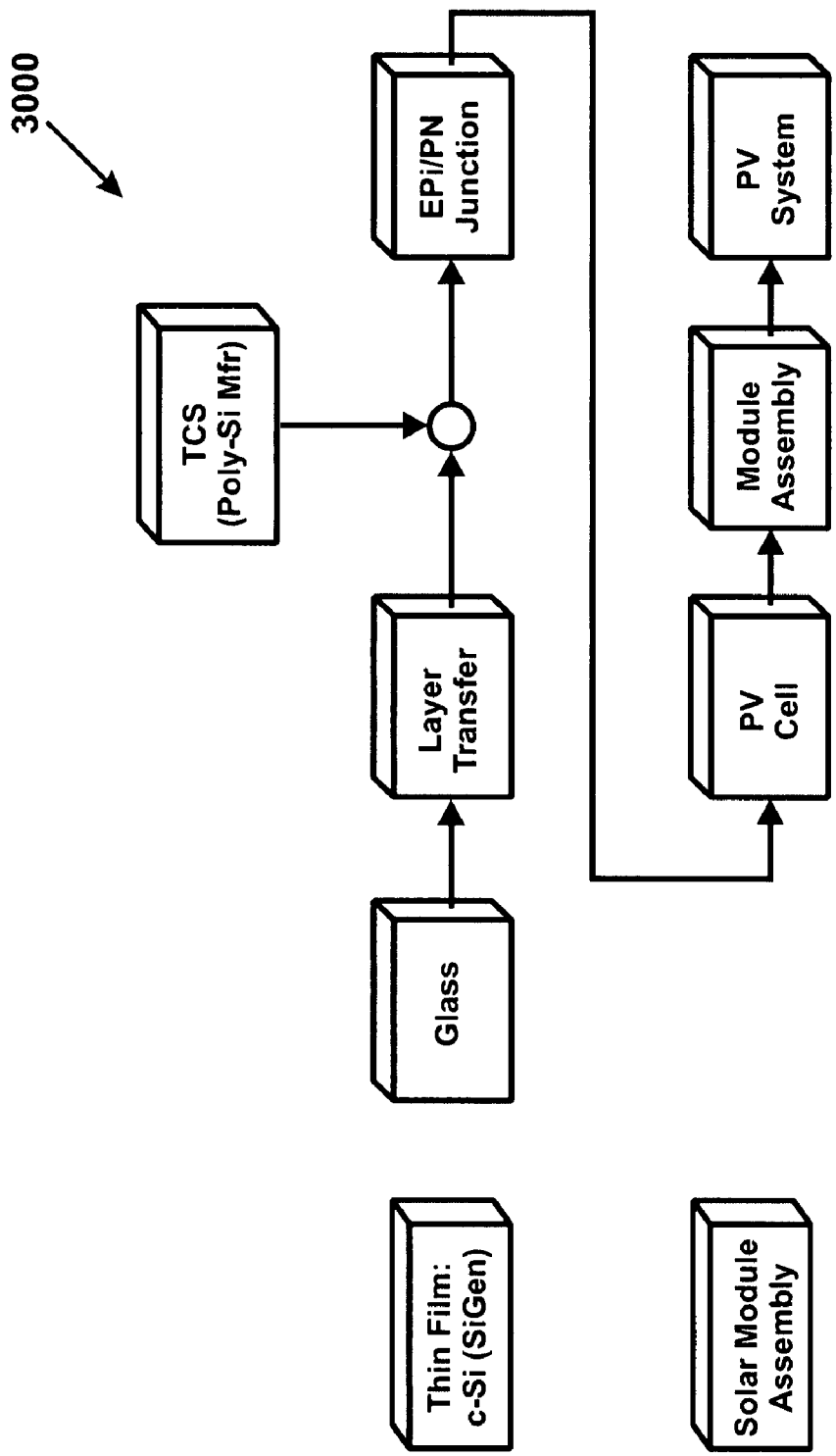
FIG. 30 is a simplified diagram of a process of forming a photovoltaic cell according to an embodiment of the present invention.

FIG. 30 is a simplified diagram of a process 3000 of forming a photovoltaic cell according to an embodiment of the present invention. This diagram is merely an example, which should not unduly limit the scope of the claims herein. One of ordinary skill in the art would recognize other variations, modifications, and alternatives. As shown, the method begins with glass, which is subjected to a layer transfer process. A layer of single crystalline silicon is now provided on the glass. A second thickening layer of epitaxially grown silicon is provided on the layer transferred silicon. After that, the composite substrate structure is subjected to formation of photovoltaic cells. The cells are provided in a module, as shown. Depending upon the embodiment, there can be other variations, modifications, and alternatives.

Figure 31:
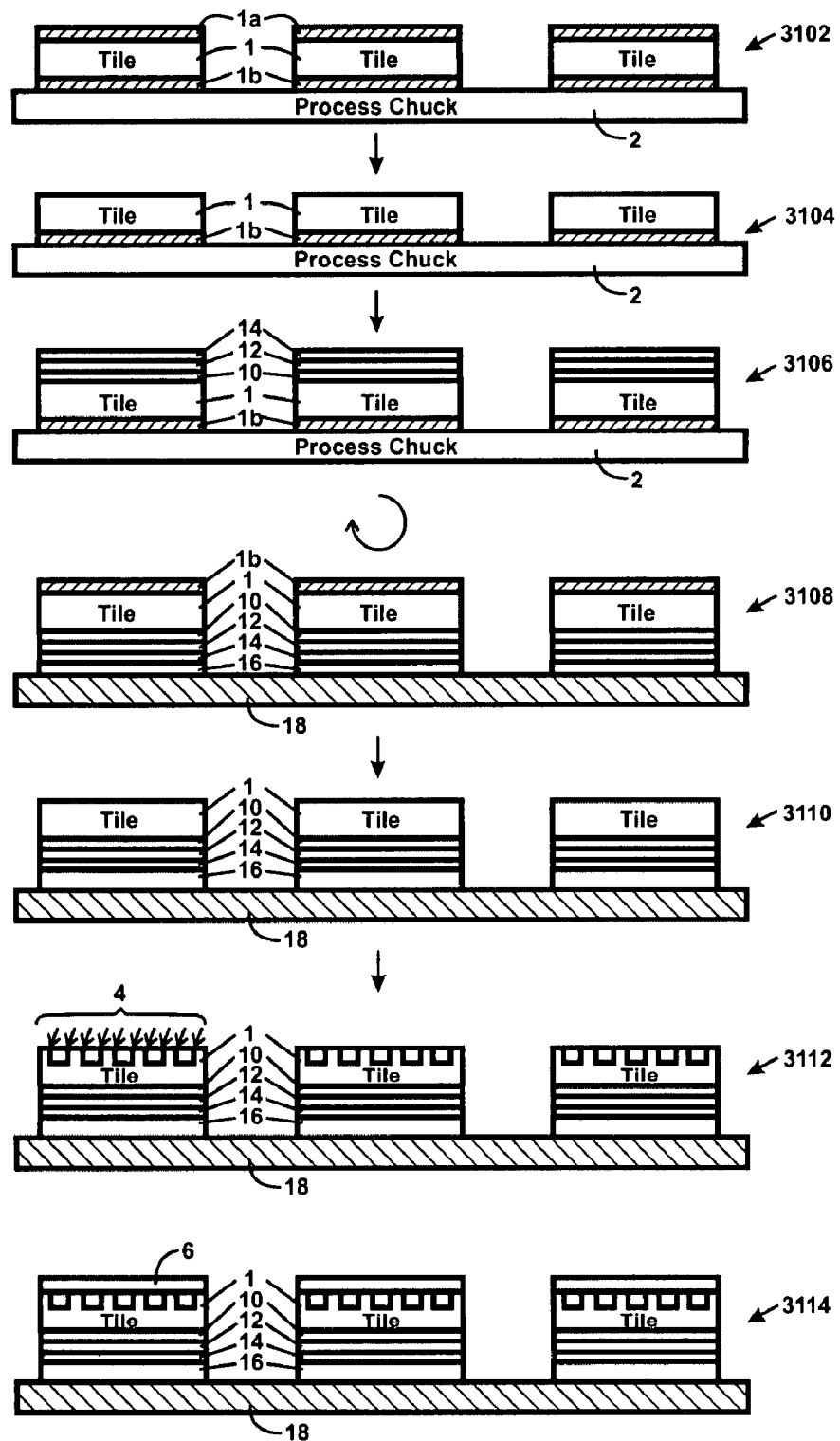
FIG. 31 is a simplified diagram of a process of forming a module including a plurality of photovoltaic cells according to an embodiment of the present invention.

As previously described, use of the Integrated Layer-Transfer Tool ($ILT^2$) concept may allow for key layer-transfer steps in the fabrication of a solar module, to be bundled together, thereby improving throughput and lowering cost. FIG. 31 shows a simplified cross-sectional view of a number of steps that may be performed utilizing a $ILT^2$ according to a first embodiment of a process 3100 of the present invention for fabricating a solar cell.

In a first step 3102, a plurality of tiles 1 bearing residual layers 1a and 1b (such as oxides) on the top and bottom surfaces respectively, are contacted with a process chuck or tray 2. Tiles 1 may be adhered to the process chuck 2 utilizing one of several types of forces, for example by electrostatic attraction or by vacuum suction.

In a second step 3104, tiles 1 are exposed to etching conditions to remove the residual surface layers 1a from their top surfaces. In accordance with certain embodiments, removal of this residual material may be accomplished through exposure to a plasma, for example a fluorine-based plasma. In accordance with other embodiments, removal of this residual layer may be accomplished by exposure to a wet etching chemistry such as HF.

In the next step 3106, a stack of layers 10, 12, and 14 are then formed in succession on the top surface of the tile. First layer 10 comprises a passivating layer, such as silicon nitride, that serves to protect the top surface of the tile. Second layer 12 comprises a light trapping layer (light randomization to make the absorber capture more light), such as an etched or faceted film surface or other suitable material and structure, that will function to cause light that has penetrated through the tile to go back into the tile be collected to improve overall cell efficiency. Third layer 14 comprises a light coupling layer.

Next, while still adhered to the process chuck, as shown in step 3108 the process chuck 2 is inverted ("flipped"), and the light coupling layer 14 of the tiles is placed into contact with and bonded to a substrate 18. In accordance with particular embodiments of the present invention, this substrate may be transparent (for example a glass plate) to allow incident light to access to the tile.

Adhesion between the light coupling layer on the tile, and the underlying substrate, may be achieved in several possible ways. According to one embodiment, the light coupling layer on the tile surface may be adhered to the underlying substrate through the application of a voltage differential, for example utilizing an electro-static bonding technique as previously described.

An alternative approach is to employ an adhesive 16. The adhesive may comprise a soft organic adhesive (such as polyvinyl acetate—PVA) having favorable light coupling abilities. In accordance with certain embodiments, the adhesive may be patterned on the substrate prior to attachment of the tiles. In accordance with other embodiments, the adhesive may be placed on the top of the tiles prior to their inversion and attachment to the substrate.

Next, as shown in step 3110, the residual surface layer 1b formerly remaining on the bottom of the tile is removed, either by exposure to plasma or wet etching chemistries, typically fluorine-based.

Next, as shown in step 3112, the P/N junctions 4 critical to gathering energy from incident light, are formed in the tile. These P/N junctions are typically formed by the introduction of dopant, for example through ion implantation, diffusion-type processes, or non-contact methods such as inkjet printing of dopant precursors. Some heat treatment may be made to allow P/N junctions to form. Finally, as shown in step 3114, a passivation layer 6 (such as silicon nitride) is formed over the tile surface that contains the P/N junctions.

Processes for forming a solar cell in accordance with the present invention are not limited to the specific embodiment shown in FIG. 31. One of skill in the art would recognize that different steps, and different orders of steps, may be employed and still result in formation of a solar cell device. For example, in FIG. 31, the order of formation of the P/N junctions and the passivation layer could easily be reversed, with the P/N junctions being formed by implantation of ions through a passivation layer that has already been formed on the surface of the tiles.

Moreover, certain processing steps may take place after formation of the PIN junctions and the passivation. For example, subsequent processing can include selective removal of passivation to allow the selective formation of conducting contacts with the P/N junctions, to draw the electrical energy away from the tile. In accordance with particular embodiments, conducting contacts to the P- and N-type regions could be formed on the same side of the tile (in this case the backside to allow for simpler contacting with the module. In accordance with other embodiments of the present invention, however, the conducting contacts to the P-type and N-type regions could be positioned on opposite sides of the tile to fabricate a transverse-type cell.

The diagram of FIG. 31 is merely an example, which should not unduly limit the scope of the claims herein. One of ordinary skill in the art would recognize other variations, modifications, and alternatives. As shown, the method begins with glass, which is subjected to a layer transfer process. A layer of single crystalline silicon is now provided on the glass. A second thickening layer of epitaxially grown silicon is provided on the layer transferred silicon. After that, the composite substrate structure is subjected to formation of photovoltaic cells. The cells are provided in a module, as shown. Depending upon the embodiment, there can be other variations, modifications, and alternatives.

Figure 32:
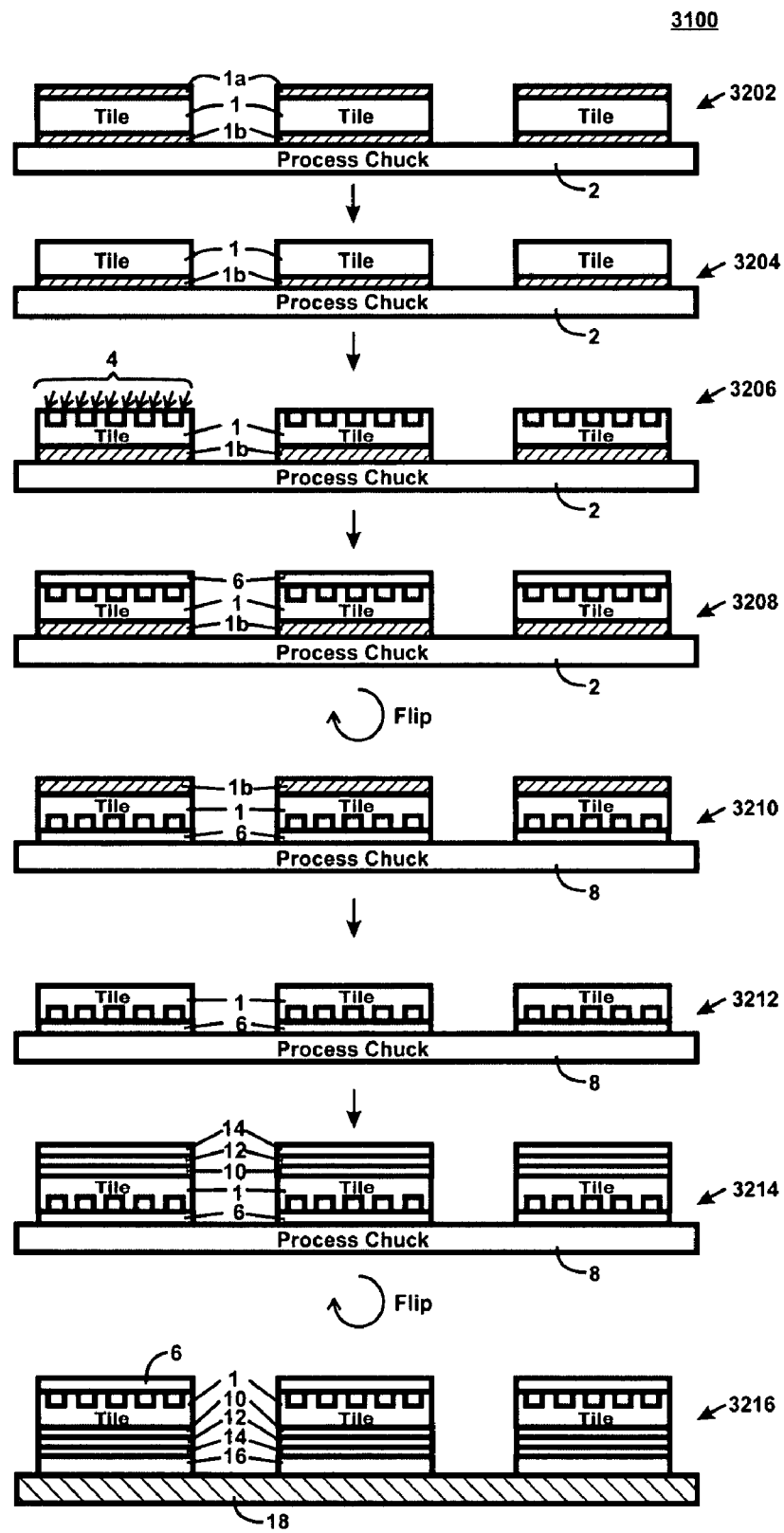
FIG. 32 is a simplified diagram of a process of forming a module including a plurality of photovoltaic cells according to an alternative embodiment of the present invention.

FIG. 32 presents a simplified diagram of an alternative process 3200 of forming a photovoltaic cell according to an embodiment of the present invention. In a first step 3202, a plurality of tiles 1 bearing residual layers 1a and 1b (such as an oxide) on the top and bottom surfaces respectively, are contacted with a process chuck or tray 2. Tiles 1 may be adhered to the process chuck 2 utilizing forces such as electrostatic attraction or vacuum suction.

In a second step 3204, tiles 1 are exposed to etching conditions to remove the residual material present on the top tile surface. In accordance with certain embodiments, removal of this residual surface material may be accomplished by exposure to a plasma, for example a fluorine-based plasma. In accordance with other embodiments, removal of this residual surface layer may be accomplished by exposure to a wet etchant such as HF.

In the next step 3206, the P/N junctions 4 critical to gathering energy from incident light, are formed in the tile. These P/N junctions are typically formed by the introduction of dopant, for example through implantation, diffusion-type processes, or non-contact methods such as inkjet printing of dopant precursors. Some heat treatment may be made to allow PIN junctions to form. In step 3206 a passivation layer (such as silicon nitride) is then formed over the tile surface containing the P/N junctions. As described above in connection with the previous embodiment of FIG. 31, the order of formation of the P/N junctions and the passivation layer could readily be reversed, with implantation to form the P/N junctions occurring through a passivation layer that has already been formed.

Next, with tiles still attached, in step 3210 the process chuck 2 is inverted ("flipped") and the tiles are placed into contact with a second process chuck 8. The tiles may be adhered to the second chuck 8 utilizing different forces, for example vacuum suction or electrostatic force. The tiles are then released from the first process chuck.

Next, as shown in step 3212, the residual surface layer formerly remaining on the bottom of the tile is removed, either by exposure to a plasma etching ambient or wet etching chemistry, typically fluorine-based.

As shown in step 3214, layers 10, 12, and 14 are then formed in succession on the top surface of the tile. First layer 10 comprises a passivating layer, such as silicon nitride, that serves to protect the top surface of the tile. Second layer 12 comprises a light trapping layer (light randomization to make the absorber capture more light), such as an etched and faceted film surface or other suitable material and structure that will function to cause light that has penetrated through the tile to go back into the tile be collected to improve overall cell efficiency. Third layer 14 comprises a light coupling layer.

Next, while still adhered to the second process chuck 8, as shown in step 3216 the process chuck is inverted ("flipped") and the light coupling layer on the tiles is placed into contact with and bonded to a substrate 18. In accordance with particular embodiments of the present invention, this substrate 18 may be transparent (for example a glass plate) to allow incident light access to the tile.

Adhesion between the light coupling layer on the tile, and the underlying substrate, may be achieved in several possible ways. According to one embodiment, the light coupling layer on the tile surface may be adhered to the underlying substrate through the application of a voltage differential, utilizing an electro-static bonding technique as previously described.

An alternative approach is to utilize an adhesive 16. The adhesive may comprise a soft organic adhesive (such as polyvinyl acetate—PVA) having favorable light coupling abilities. In accordance with certain embodiments, the adhesive may be patterned on the substrate prior to attachment of the tiles. In accordance with other embodiments, the adhesive may be patterned on the top of the tiles prior to their inversion and attachment to the substrate.

As with the previous embodiment of FIG. 31, certain further processing steps may take place to complete formation of the solar module or cell. For example, subsequent processing can include selective removal of passivation to allow the selective formation of conducting contacts with the P/N junctions, to draw the electrical energy away from the tile. In accordance with particular embodiments, conducting contacts to the P- and N-type regions could be formed on the same side of the tile (in this case the backside to allow for simpler contacting with the module. In accordance with other embodiments of the present invention, however, the conducting contacts to the P-type and N-type regions could be positioned on opposite sides of the tile to form a transverse-type cell.

The processes described above in connection with FIGS. 31 and 32 differ in certain respects. For example, the process of FIG. 31 requires use of only one process chuck or tray, and employs only a single inversion step prior to bonding of the tile to the substrate. However, the process embodiment of FIG. 31 involves formation of the P/N junctions in the tile while it is attached to the substrate. This may mean that the substrate is exposed to higher temperatures, requiring the use of more expensive substrate materials able to withstand higher temperatures. Exposure of the substrate to a higher temperature may also require careful consideration of the method by which the tile is bonded to the substrate, so that this bond is not disrupted by the later processing.

By contrast, in the process embodiment of FIG. 32, the tile is subjected to high temperature steps prior to being bonded to the substrate. This advantage, however, comes at the expense of more complex processing requiring two different process chucks and inversion steps prior to bonding to the substrate.

Both of the embodiments just discussed offer the advantage that all of the tiles within a given solar module would be processed simultaneously, thereby lowering the cost of fabricating the module. Moreover, such simultaneous batch processing of all tiles grouped within a particular module, is also consonant with the simultaneous processing of those tiles to accomplish layer transfer.

Figure 33:
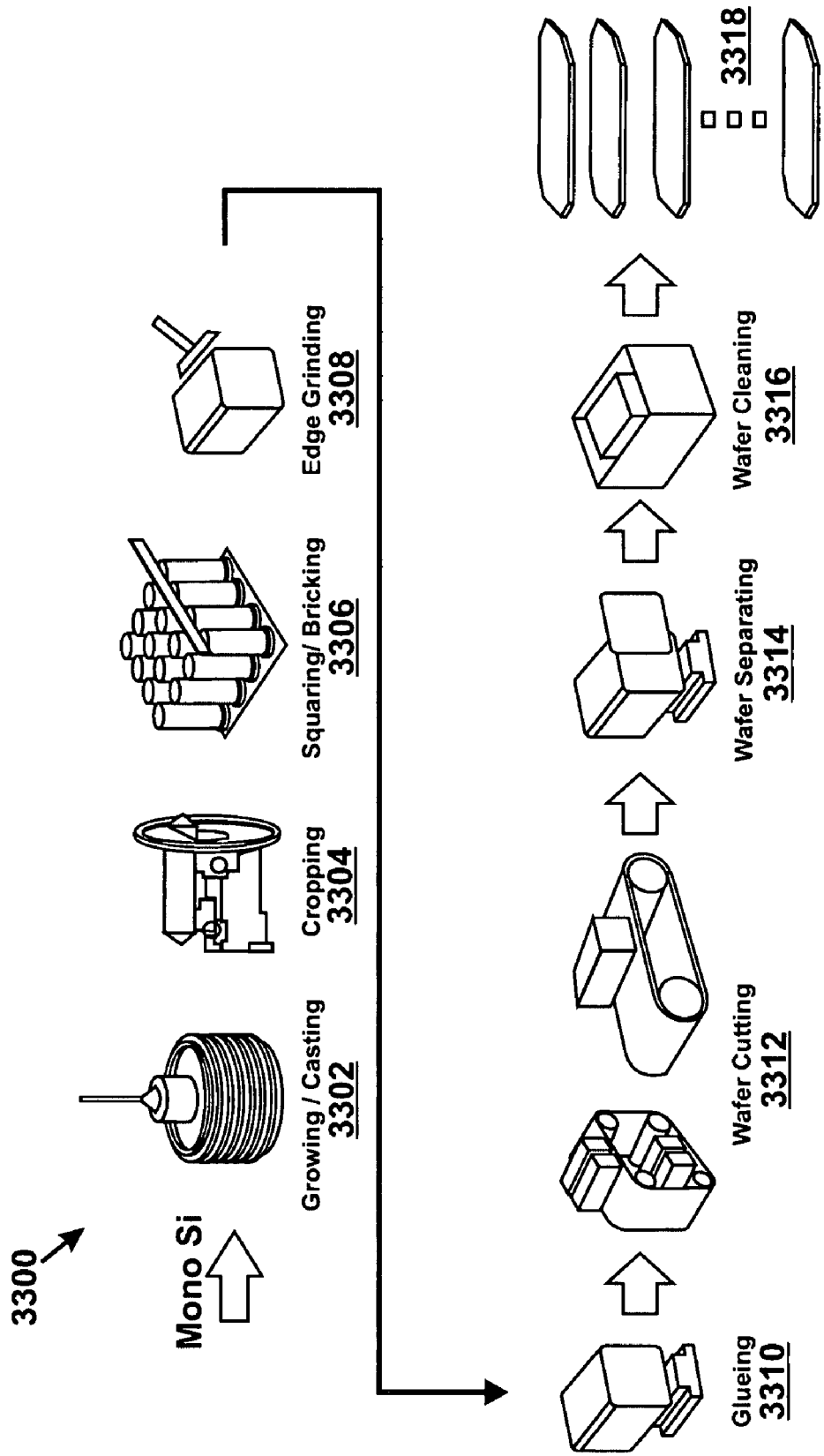
FIG. 33 is a simplified diagram of a conventional process flow for forming raw material for incorporation into a solar apparatus.

For example, FIG. 33 shows a simplified conventional process flow 3300 for the forming individual elements of a module. In step 3302, an ingot or boule of monocrystalline silicon exhibiting a substantially cylindrical shape is created by growing or casting. In step 3304, the ends of the ingot or boule are cropped by sawing. In step 3306, the shape of the cropped ingot or boule is converted to square rather than circular, by shaving the sides. In step 3308, the edges of the shaved sides are ground to smoothen them, resulting in the brick shape having a square cross-section.

Conventionally, as shown in steps 3310-12, the brick ingot is then glued to a support and then exposed to a plurality of cutting processes (for example wire sawing) in order to form individual wafers. As shown in steps 3314 and 3316, these wafers are then separated and individually cleaned to yield step 3318 in the plurality of individual substrates. A disadvantage of the conventional approach shown in FIG. 33 is its relatively high consumption of both consumables (such as glues, wire saws, and cleaning fluids), and valuable single crystal silicon material lost during processing.

Figure 34:
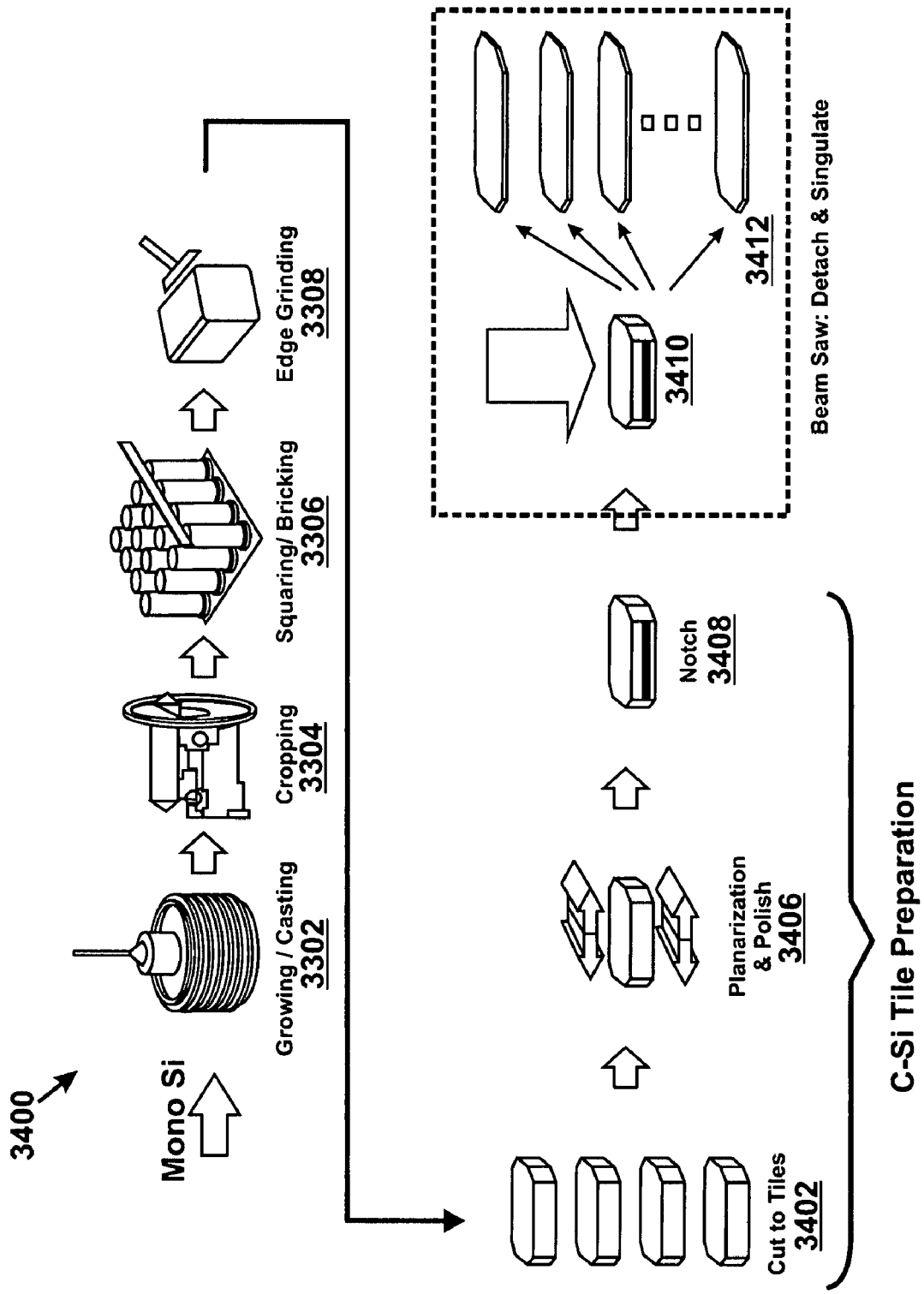
FIG. 34 is a simplified diagram of a conventional process flow for forming raw material for incorporation into a solar apparatus in accordance with an embodiment of the present invention.

The conventional process of FIG. 33 may be contrasted with that of FIG. 34, which shows a simplified view of a process for preparing elements of a module in accordance with an embodiment of the present invention. Specifically, the process embodiment shown in FIG. 34 shares with the conventional process, the preliminary steps 3302-3308 of ingot/boule creation, cropping, squaring, and edge grinding.

However, as shown in step 3402 of FIG. 34, rather than being cut into the individual (wafer) elements of the module, embodiments of the present invention separate the brick ingot into a plurality of thick tiles, whose surfaces are then planarized/polished (step 3406). In step 3408, a notch feature may then be formed in each tile.

As shown in step 3410, individual elements of the module are then detached and singulated from the tile, for example by ion implantation followed by the separation of films that may or may not be of sufficient thickness to be free-standing. As shown in step 3412, detachment and singulation yields the individual elements of a larger module. In accordance with one embodiment of the present invention, these individual elements may represent substantially square single crystal silicon wafers having lateral dimensions of 125×125 mm.

Various aspects of the detachment and singulation of films of material according to embodiments of the present invention have been described in other United States patent applications co-pending herewith. For example, U.S. Provisional Patent Applications 60/886,827 and 60/886,912 filed Jan. 26, 2007, both of which are incorporated by reference in their entireties herein, describe the singulation of thin films from a parent bulk material by implantation of ions at energies of at least 600 keV into the surface of the parent bulk material.

The avoidance of having to saw and clean each individual wafer avoids many of the consumables cost and loss of single crystal material associated with the conventional process. Moreover, this final step of detaching and singulation of wafers can be performed with a batch of ingots, allowing the simultaneous fabrication of the plurality of elements making up the module.

Figure 36:
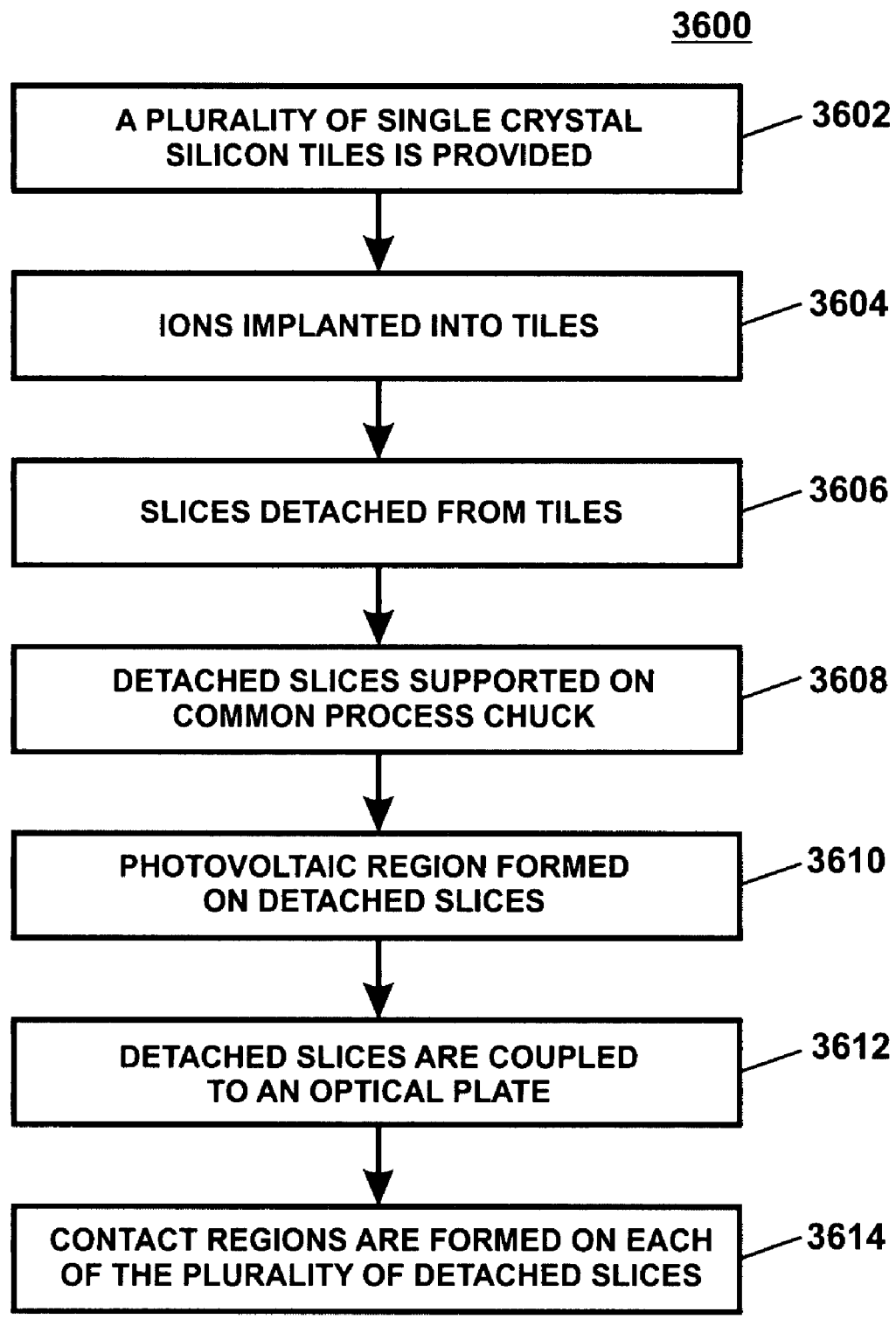
FIG. 36 shows a simplified flow diagram of an embodiment of a method in accordance with the present invention for fabricating a solar module comprising a plurality of individual photovoltaic cells.

FIG. 36 shows a simplified flow diagram of an embodiment of a method 3600 in accordance with the present invention for fabricating a solar module comprising a plurality of individual photovoltaic cells. In step 3602, a plurality of single crystal silicon tiles is provided, each of the single crystal tiles having a thickness capable of forming a plurality of free standing slices, and each of the single crystal tiles having a surface region. Next, in step 3604, ions are implanted through the surface region of each of the single crystal silicon tiles. In step 3606, at least one of the slices is detached from each of the single crystal silicon tiles to form a plurality of detached slices. In step 3608, a plurality of detached slices are supported on a common process chuck. In step 3610, one or more photovoltaic regions are formed on each of the plurality of supported detached slices. In step 3612, each of the plurality of detached slices is coupled to an optical plate. In step 3614, one or more contact regions are formed on each of the plurality of detached slices, which is coupled to the optical plate, to form a solar module.

As discussed above, and particularly in connection with FIG. 22, embodiments in accordance with the present invention allow substrates to be bonded together utilizing a voltage potential difference applied between them. This voltage potential can give rise to heating along the interface between the substrates that causes bonding to occur. Moreover, the successful singulation of thin films of material to form the individual units making up a module, may depend upon the exercise of precise temperature control, for example at the time of implanting an ion into the surface of a bulk material.

Figure 35:
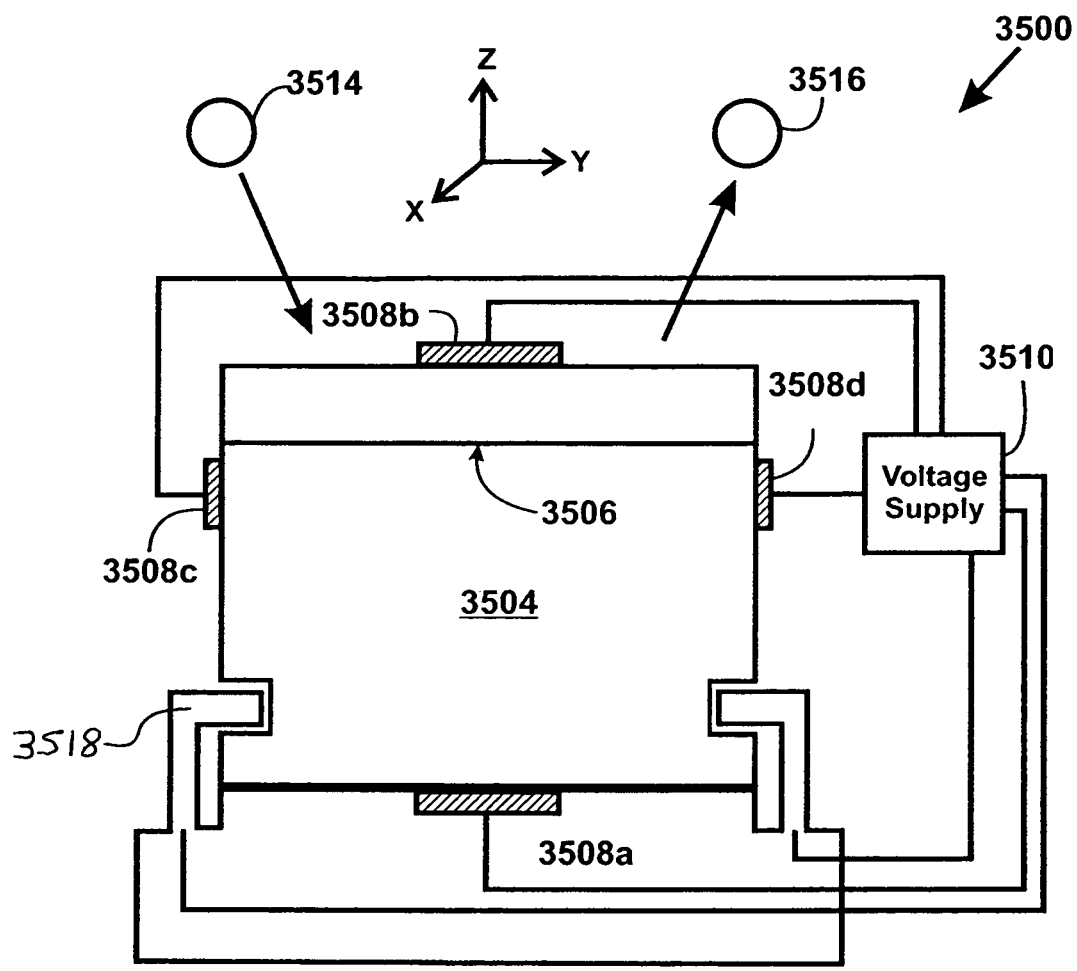
FIG. 35 is a simplified diagram of an apparatus in accordance with an embodiment of the present invention for controlling a temperature of substrates during bonding or layer transfer processes.

Accordingly, FIG. 35 presents a simplified cross-sectional view of an embodiment of an apparatus 3500 in accordance with the present invention, for controlling the temperature along an interface between a pair of substrates during bonding or layer transfer processes. Specifically, substrate pair 3502 and 3504 are in contact along interface 3506. A plurality of electrical contacts 3508 in electrical communication with a voltage supply 3510, are present with the substrates at different regions, in order to create voltage differentials having an intensity and polarity optimal for bonding.

For example, a first electrical contact 3508a may be positioned in the member 3512 supporting the lower substrate. A second electrical contact 3508b may be positioned on top of the upper substrate. Application of a potential difference between contacts 3508a and 3508b creates a gradient of resistive heating in the Z-direction. Depending upon variables such as the thickness of the respective substrates, and their composition and hence electrical resistance, this thermal gradient can be tailored to yield a particular value at the substrate interface, thereby producing a particular type of bonding.

Similarly, a thermal gradient having a lateral component can also be created by the application of potential differences between electrical contacts selectively positioned along the X- and Y-directions. For example, a third electrical contact 3508c may be positioned on one side of the first substrate, and a fourth electrical contact 3508d may be positioned on the opposite side of the first substrate, at approximately the height of the interface 3506. Application of a potential difference between these contacts would give rise to resistive heating in the first substrate along the interface, again producing bonding of a particular character.

Of course, by selective placement of a multitude of electrical contacts at different points in space, resistive heating resulting in thermal gradients of almost any variety, can be generated to suit a particular bonding property.

Moreover, the character of the thermal gradients created by resistive heating could be further modified by the presence of outside energy sources 3514 or sinks 3516. For example, the top substrate 3502, bottom substrate, or both, could be exposed to additional convection or conduction heating, for example from a laser, lamp, or flow of heated gas, resulting in modification of thermal gradient resulting at the interface. Alternatively, a portion of one or both of the substrates could be in contact with a cooling member, for example a Peltier cooler or a flow of cooled gas, thereby also modifying the thermal gradient and hence the bonding occurring at the substrate interface.

The points of application of the potential difference may serve other functions as well. For example, as shown in the embodiment of FIG. 35, the voltage potential could be applied to the lower substrate through a mechanical clamp structure 3518 configured to engage a notch in the base of that substrate, for example as has been described above in connection with single crystal silicon tiles.

Figure 35A:
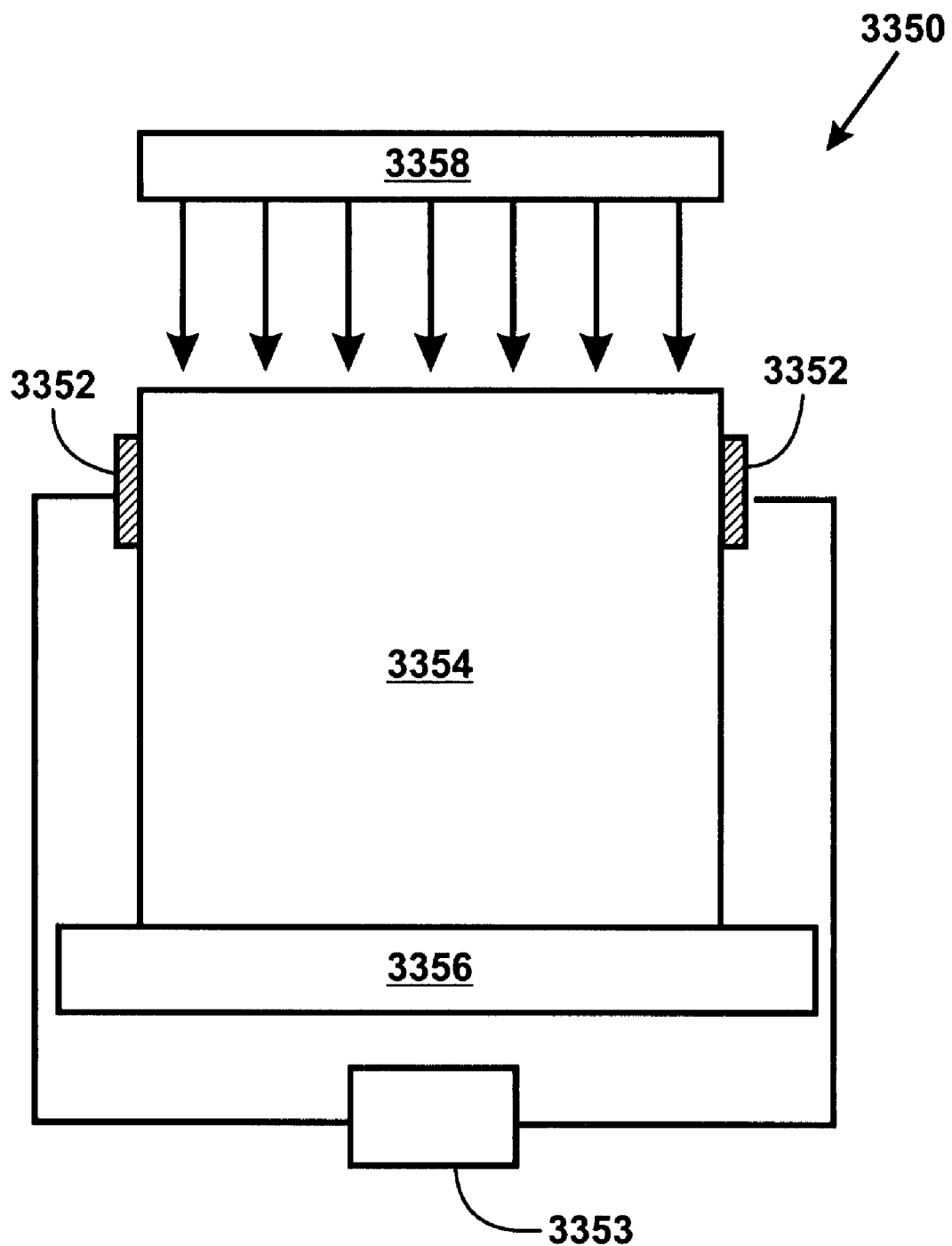
FIG. 35A is a simplified diagram of an apparatus in accordance with an embodiment of the present invention for controlling a temperature during singulation of a film from a parent bulk material.

Apparatuses in accordance with embodiments of the present invention are not limited to providing resistive heating along an interface between multiple substrates that are to be bonded together. For example, FIG. 35A shows a simplified cross-sectional view of an alternative embodiment of an apparatus 3550 in accordance with the present invention, which features plurality of conductive contacts 3352 in connection with a voltage supply 3353 and in contact with a bulk material 3354 disposed on a support 3356. Surface 3354a of the bulk material is configured to receive ions implanted from a source 3358, and contacts 3352 are disposed to provide temperature control in the form of resistive heating at the expected depth of singulation of a film from the bulk material. Source 3358 can also be a capacitively coupled electrode structure that coupled electrical heat energy into the tile area.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. In certain embodiments, the backing substrate can be applied to each of the substrates, including handle and donor. In alternative embodiments, coatings may also be provided on surfaces or other regions of the transparent material. Therefore, the above description and illustrations should not be taken as limiting the scope of the present invention which is defined by the appended claims.

What is claimed is:

1. A method for fabricating a photovoltaic cell, the method comprising:
   providing a reusable substrate having a surface region, a cleave region, and a total thickness of material, the total thickness of material being at least N times greater than a first thickness of material to be removed, the first thickness of material to be removed being between the surface region and the cleave region;
   coupling the surface region of the reusable substrate to a first surface region of an optically transparent substrate, the optically transparent substrate comprising the first surface region and a second surface region;
   contacting a first electrode to a first region of the reusable substrate, and contacting a second electrode to a second region of the reusable substrate; and
   providing a first voltage through the first electrode at the first region and a second voltage through the second electrode at the second region of the reusable substrate to create a voltage differential across the first and second regions to cause an increase in energy at one or more portions of the cleave region to facilitate removal of the first thickness of material from the reusable substrate, while the surface region remains coupled to the first surface region, to form a cleaved surface region coupled to the first surface region of the optically transparent substrate.

2. The method of claim 1 further comprising subjecting the cleaved surface region using at least a mechanical polishing or a chemical etching process to remove a portion of a hydrogen damaged layer from the cleaved surface region.

3. The method of claim 1 further comprising plasma activating the surface region and the first surface region before coupling the surface region to the first surface region.

4. The method of claim 1 wherein the coupling comprises an optical coupling material between the surface region and the first surface region.

5. The method of claim 4 wherein the optical coupling material comprises a tin oxide, indium tin oxide, zinc oxide, or titanium dioxide.

6. The method of claim 1 further comprising forming a second thickness of semiconductor material using at least a solid phase epitaxy process or a gaseous phase epitaxial process to form substantially single crystal silicon material.

7. The method of claim 1 further comprising forming a second thickness of semiconductor material using at least forming an amorphous silicon layer.

8. The method of claim 7 further comprising crystallizing the amorphous silicon layer.

9. The method of claim 1 wherein the first thickness of semiconductor material comprises a single crystal silicon material.

10. The method of claim 1 wherein the optically transparent material comprises a glass substrate or a quartz substrate or a plastic substrate.

11. The method of claim 1 wherein the optically transparent material comprises a conductive material including indium tin oxide or tin oxide.

12. The method of claim 1 wherein the thickness of material comprises one or more photovoltaic regions, the one or more photovoltaic regions comprising a first electrode and a second electrode.

13. The method of claim 1 wherein the cleaving comprises a controlled cleaving process.

14. The method of claim 1 wherein the cleaving comprises an initiation process and a propagation process to free the first thickness of material from a remaining portion of the semiconductor substrate.

15. The method of claim 1 wherein the voltage differential ranges from about 0.1 Volts to about 100 Volts.

16. The method of claim 1 wherein the voltage differential is provided between a first electrode and a second electrode, the first electrode being coupled to the first region and the second electrode being coupled to the second region.

17. A method fabricating one or more semiconductor substrates, the method comprising:
    providing a reusable substrate having a surface region, a cleave region, and a total thickness of material, the total thickness of material being at least N times greater than a first thickness of material to be removed, the first thickness of material to be removed being between the surface region and the cleave region;
    contacting a first electrode to a first region of the reusable substrate, and contacting a second electrode to a second region of the reusable substrate; and
    providing a first voltage through the first electrode at the first region and a second voltage through the second electrode at the second region of the reusable substrate to create a voltage differential across the first and second regions to cause an increase in energy at one or more portions of the surface region to facilitate bonding of the surface region to a first surface region of a handle substrate.

18. The method of claim 17 wherein the increase in energy causes an increase in temperature of the surface region from a first temperature to a second temperature.

19. The method of claim 17 wherein the increase in energy causes an increase in temperature from a first temperature to a second temperature, the second temperature being greater than about 200 Degrees Celsius.

20. A method of fabricating one or more semiconductor substrates, the method comprising:
    providing a reusable substrate having a surface region, a cleave region, and a total thickness of material, the total thickness of material being at least N times greater than a first thickness of material to be removed, the first thickness of material to be removed being between the surface region and the cleave region; and
    providing a first voltage at a first region and a second voltage at a second region of the reusable substrate to create a voltage differential across the first and second regions to cause an increase in energy at one or more portions of the cleave region to change a characteristic of the cleave region from a first characteristic to a second characteristic, the second characteristic causing removal of the first thickness of material from the reusable substrate.

21. The method of claim 20 wherein the voltage differential increases a temperature of one or more portions of the surface region to cure a bonding layer provided overlying the one or more portions of the surface region.

22. A method fabricating one or more semiconductor substrates, the method comprising:
    providing a reusable substrate having a surface region, a cleave region, and a total thickness of material, the total thickness of material being at least N times greater than a first thickness of material to be removed, the first thickness of material to be removed being between the surface region and the cleave region;
    contacting a first electrode to a first region of the reusable substrate, and contacting a second electrode to a second region of the reusable substrate; and
    providing a first voltage through the first electrode at the first portion of the reusable substrate and a second voltage through the second electrode at the second portion of the reusable substrate, thereby subjecting a voltage differential between a first region and a second region of the reusable substrate to cause an increase in energy at one or more portions of the surface region.

23. The method of claim 22 wherein the increase in energy facilitates bonding of the surface region to a first surface region of a handle substrate.

24. The method of claim 22 wherein the increase in energy causes an increase in temperature of the surface region from a first temperature to a second temperature.

25. The method of claim 22 wherein the increase in energy causes an increase in temperature from a first temperature to a second temperature, the second temperature being greater than about 200 Degrees Celsius.

* * * * *